(12) United States Patent
Ikeda et al.

(10) Patent No.: US 6,403,421 B1
(45) Date of Patent: Jun. 11, 2002

(54) SEMICONDUCTOR NONVOLATILE MEMORY DEVICE AND METHOD OF PRODUCING THE SAME

(75) Inventors: Naoshi Ikeda; Ikuhiro Yamamura; Hidetoshi Yamanaka, all of Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/583,906

(22) Filed: May 31, 2000

Related U.S. Application Data

(62) Division of application No. 09/293,763, filed on Apr. 19, 1999.

(30) Foreign Application Priority Data

| Apr. 22, 1998 | (JP) | 10-112499 |
| Jul. 7, 1998 | (JP) | 10-191320 |
| Aug. 10, 1998 | (JP) | 10-226265 |

(51) Int. Cl.$^7$ ............................................. H01L 21/336
(52) U.S. Cl. ...................................... 438/267; 438/304
(58) Field of Search ................................ 438/267, 304; 257/317

(56) References Cited

U.S. PATENT DOCUMENTS 5,021,848 A * 6/1991 Chiu ........................... 257/317
5,756,384 A * 5/1998 Tseng .......................... 438/257

* cited by examiner

*Primary Examiner*—Trung Dang
*Assistant Examiner*—William M. Brewster
(74) *Attorney, Agent, or Firm*—Ronald P. Kananen; Rader, Fishman & Grauer PLLC

(57) ABSTRACT

A semiconductor nonvolatile memory device using SA-STI cells improved in quality and suitable for increasing the degree of integration is provided with a semiconductor substrate having in its surface a channel formation region; an element isolation insulating film buried in a trench formed in the semiconductor substrate so as to divide the channel formation region into a plurality of regions; a gate insulating film formed on the channel formation region; a floating gate provided with a first floating gate formed at an upper layer of the gate insulating film and second floating gates formed at facing sides of the same; an inter-layer insulating film formed at an upper layer of the first floating gate and the second floating gates; a control gate formed at an upper layer of the inter-layer insulating film; and a source-drain region former connected to the channel formation region.

6 Claims, 22 Drawing Sheets

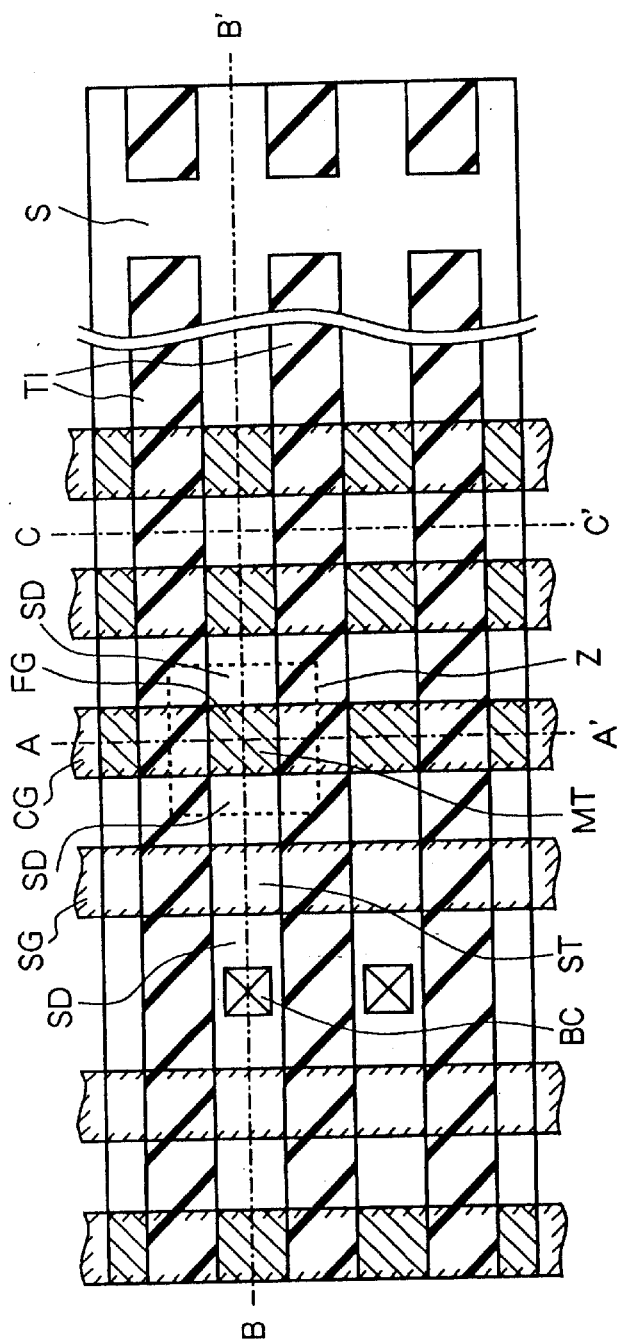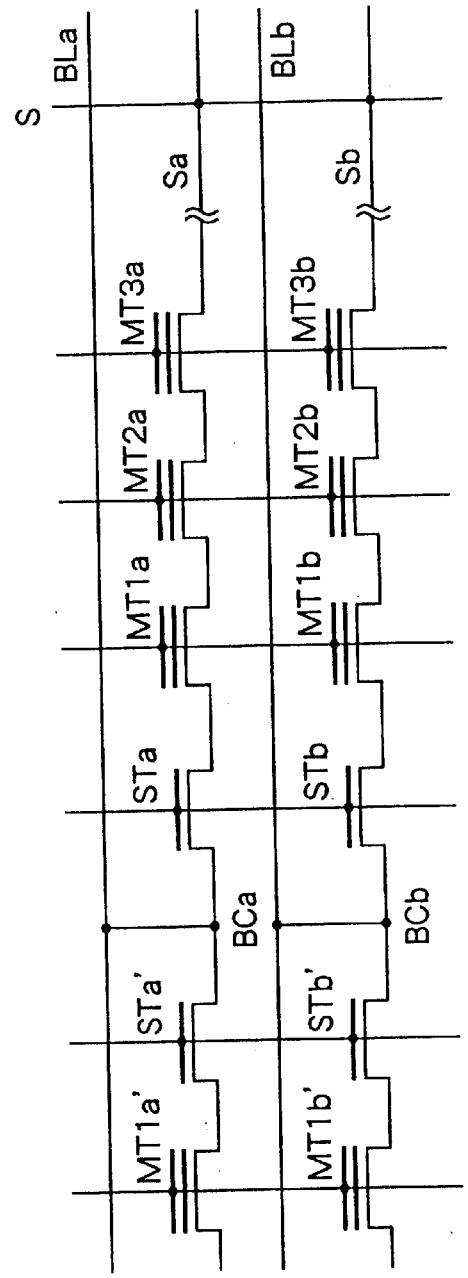
FIG.2A
FIG.2B

SEMICONDUCTOR NONVOLATILE MEMORY DEVICE AND METHOD OF PRODUCING THE SAME

This application is a divisional of application Ser. No. 09/293,763 filed Apr. 19, 1999.

BACKGROUND OF THE INVENTION

1. Field of the Invention

The present invention relates to a semiconductor nonvolatile memory device and a method of producing the same, more particularly relates to a semiconductor nonvolatile memory device having nonvolatile memory cell of floating gate type MOS transistors and a method of producing the same.

2. Description of the Related Art

In recent years, as semiconductor nonvolatile memory devices, there have been active development and commercialization of erasable programmable read-only memories (EPROM) using floating gate type MOS transistors, electrically erasable programmable read-only memories (EEPROM), flash memories, ones of EEPROMS, adopting full erasure methods, etc.

The above-mentioned flash memories include NOR type flash memories and NAND type flash memories. The former use single floating gate type MOS transistor as the memory cell of the flash memory, while the latter use a NAND cell comprised of adjoining memory cells comprised of a plurality of, for example, N number of floating gate type MOS transistors as a unit cell.

Such NAND type flash memories are slower in speed of random access compared with NOR type flash memories, but are superior in terms of degree of integration, so have been developed and commercialized in recent years as flash memories for increasing the degree of integration.

A sectional view of an example of the above floating gate type of semiconductor nonvolatile memory device is shown in FIG. 1. A gate insulating film (tunnel insulating film) 20a comprised of for example a thin film of silicon oxide is formed on an active region of a semiconductor substrate 10 isolated by an element isolation insulating film 24a formed by for example the LOCOS method. A floating gate 30b comprised of for example polycrystalline silicon is formed at an upper layer. Further, an inter-layer insulating film 25a comprised of for example an oxide-nitride-oxide stacked insulating film (ONO film) is formed at an upper layer thereof. At an upper layer of the inter-layer insulating film 25a is formed a control gate 31 of a polycide structure comprised of for example a lower control gate 31a of polycrystalline silicon and an upper control gate 31b of tungsten silicide. In the semiconductor substrate 10, not shown source-drain diffusion layers are formed at the two sides of the control gate 31. Due to this, a field effect transistor is comprised, having a floating gate 30b covered by an insulating film between the control gate 31 and the channel formation region In the semiconductor substrate 10.

In the floating gate type semiconductor nonvolatile memory device having the above structure, the floating gate 30b has the function of holding the charge in the film while the gate insulating film 20a and the inter-layer insulating film 25a have the role of sealing the charge in the floating gate 30b. When a suitable voltage is applied to the control gate 31, semiconductor substrate 10, source-drain diffusion layer, etc., a Fowler-Nordheim type tunnel current (FN current) is caused, a charge is injected through a gate insulating film 20a from the semiconductor substrate 10 to the floating gate 30b, or a charge is released from the floating gate 30b to the semiconductor substrate 10.

If a charge is stored in the floating gate 30b, a field is generated by the stored charge, therefore threshold voltage of the transistor changes. Data can be stored by this change. For example, it is possible to erase data by storing a charge in the floating gate 30b or to write data by releasing the charge stored in the floating gate 30b.

The floating gate type semiconductor nonvolatile memory device of the above related art, however, has an overlap portion I as a margin for connection of the floating gate 30b and the element isolation insulating film 24a. In particular, an element isolation insulating film obtained by the LOCOS method has a bird's beak, so the element isolation width becomes greater and the isolation voltage resistance falls. This makes it difficult to reduce the cell area.

To solve the above problem, a floating gate type semiconductor nonvolatile memory device having a self-aligned shallow trench isolation (SA-STI) cell structure which forms an element isolation region by self-alignment at the end of the floating gate in the width direction has been developed (see *IEDM Tech. Dig.* 1994, pp. 61 to 64). Below, an explanation will be made of a NAND type semiconductor nonvolatile memory device having an SA-STI cell structure. FIG. 2A is a plan view of this. A floating gate FG covered by an insulating film is formed between a control gate CG and channel formation region of the silicon semiconductor substrate at a region where an active region of the silicon semiconductor substrate isolated by a trench type element isolation insulating film TI intersects the control gate CG to form a word line. Further, source-drain diffusion regions SD are formed in the substrate at the two sides of the control gate CG. A plurality of field effect transistors having floating gates FG covered by an insulating film between the control gate CG and the channel formation region in the semiconductor substrate, that is, memory transistors MT, are connected in series to form a NAND column. A selection MOS transistor ST for selecting the NAND column is formed at the other end of the NAND column and has a drain diffusion layer connected through a bit contact BC to a not shown bit line. A not shown selection MOS transistor is also formed at the other end of the NAND column and has a source diffusion layer connected to the source line S.

An equivalent circuit diagram of the semiconductor nonvolatile memory device shown in the plan view of FIG. 18A is shown in FIG. 2B. Memory transistors (MT1a, MT2a, MT3a, . . . ) are connected in series to form a NAND column. A selection MOS transistor STa for selecting the NAND column is formed at one end of the NAND column and has a drain diffusion layer connected through the bit contact BCa to the bit line BLa. A not shown selection MOS transistor is formed at the other end of the NAND column and has a source diffusion layer connected through a sub source line Sa to a main source line S. Another NAND column comprised of a memory transistor MT1a' etc. selectable by a selection MOS transistor STa' is also connected to the bit line BLa. On the other hand, memory transistors (MT1b, MT2b, MT3b, . . . ) are connected in series to form a NAND column. A selection MOS transistor STb for selection of this NAND column is formed at one end of this NAND column and has a drain diffusion layer connected through the bit contact BCb to the bit line BLb. The source diffusion layer of a not shown selection MOS transistor formed at the other end of the NAND column is connected through a sub source line Sb to the main source line S.

A sectional view along the line A–A' in FIG. 2A of the semiconductor nonvolatile memory device is shown in FIG.

3A and a sectional view along the line B–B' is shown in FIG. 3B. As shown in FIG. 3A, a gate insulating film (tunnel insulating film) 20a comprised of, for example, a thin film of silicon oxide is formed on an active region of the semiconductor substrate 10 isolated by a trench type element isolation insulating film 24a. A floating gate 30b comprised of for example polycrystalline silicon is formed at the upper layer. Further, an inter-layer insulating film 25a comprised of for example an ONO film is formed at an upper layer of this. A control gate (word line) 31 covering the upper surface of the inter-layer insulating film 25a and comprised of for example polycrystalline silicon is formed. Further, as shown in FIG. 3B, source-drain diffusion layers 13 are formed in the semiconductor substrate 10 at the two sides of a control gate 31. Due to this, a field effect transistor having a floating gate 30b covered by an insulating film between the control gate 31 and the channel formation region in the semiconductor substrate 10 is formed. The transistors are connected in series in a NAND format to form a NAND column.

A selection transistor formed with a control gate of the memory cell as a gate electrode for example is connected to one end of the NAND column. The selection transistor and the memory transistors constituting the NAND column are for example covered by an inter-layer insulating film 28 comprised of for example silicon oxide. The inter-layer insulating film 28 has a bit contact hole BC formed in it reaching the drain diffusion region 13' of the selection transistor and is connected through a buried electrode 34 to a bit line 35 comprised for example of aluminum. Further, a not shown selection transistor is connected to the other end of the NAND column and has a source diffusion layer connected to a source line formed for example as a diffusion layer in the semiconductor substrate 10.

In the above semiconductor nonvolatile memory device, as shown in FIG. 3A, the element isolation region is formed by an element isolation method using an element isolation trench formed by self-alignment with an end of the floating gate in the channel width direction, that is, the so-called self-aligned shallow trench isolation (SA-STI) method.

As shown in FIG. 3A, the surface of the element isolation insulating film 24a is positioned lower than the floating gate 30b by half of its thickness. Looking at the capacitive coupling between the floating gate 30b and the control gate 31, the electrode area contributing to the capacitive coupling ratio with the floating gate 30b becomes the areas of the side walls and the top surface of the floating gate 30b.

If designing the above SA-STI cell by the minimum feature size F, a design rule, the area Z of the memory cell of the above SA-STI cell, as shown in FIG. 2A, may be designed as the theoretically smallest area, that is, $Z=4F^2$.

Therefore, if using the SA-STI cell structure to make a NAND type semiconductor nonvolatile memory device more advantageous for higher integration and thereby increasing the number of memory cells and increasing the area of the memory cell portion, it is possible to make the area of the bit line contact portion, selection MOS transistor portion, and source line portion added negligible compared with the area of the memory cell portion. Therefore, it is possible to fabricate a flash memory with the highest degree of integration within the limit of the minimum feature size.

On the other hand, when forming a floating gate by a quarter micron order of minimum feature size, by making the thickness of the floating gate a quarter micron order as well, the area of the side walls of the floating gate in the channel width direction increases and the electrode area contributing to an increase of the capacitive coupling ratio between the floating gate and control gate can also be increased. Therefore, even without providing a portion of the floating gate projecting out to the element isolation region as in the related art, it is possible to secure a desired value of the capacitive coupling ratio between the floating gate and control gate relating to the voltage of the control gate for giving a desired potential to the floating gate.

Here, an explanation will be given of a method of producing a NAND type flash memory using SA-STI cells of the above configuration, that is, a semiconductor nonvolatile memory device, with reference to FIG. 4A to FIG. 4C and FIGS. 5D to 5E.

First, as shown in FIG. 4A, a tunnel insulating film, that is, the gate insulating film 20, of a floating gate type MOS transistor is formed on the surface of the semiconductor substrate 10 on which is formed a P-type well etc. for isolation of the memory cell portion, peripheral circuit portion, etc. of a NAND type flash memory using for example the thermal oxidation method.

Next, for example, the chemical vapor deposition (CVD) method etc. is used to deposit an impurity-doped polycrystalline silicon and form a floating gate layer 30, then for example, the ordinary pressure CVD method etc. is used to deposit silicon oxide and form a first insulating film 21 at the upper layer of the same.

Next, as shown in FIG. 4B, photolithography is used to pattern the first insulating film 21, floating gate layer 30, and gate insulating film 20 to remove the first insulating film 21, floating gate layer 30, and gate insulating film 20 at the element isolation region. Then, the patterned first insulating film 21a, floating gate layer 30a, and gate insulating film 20a are used as a mask to etch the surface of the semiconductor substrate 10 and form an element isolation trench T. Next, the damage at the time of formation of the element isolation trench T is removed by heat treatment in a nitrogen atmosphere and then thermal oxidation, including protection of the edges of the gate insulating film 20a, is performed to form an element isolation trench covering film 12 comprised of silicon oxide at the inner walls of the element isolation trench T. Note that at the time of thermal oxidation, the side walls of the floating gate layer 30 are also oxidized to form a floating gate covering film 26 of silicon oxide.

Next, the ion implantation method is used to implant for example boron (B) ions and form a channel stopping layer 11 at the bottom of the element isolation trench T.

Next, as shown in FIG. 4C, for example, the reduced pressure CVD method etc. is used to deposit silicon oxide over the entire surface to form the element isolation layer 24 covering the first insulating film 21a and floating gate layer 30a and burying the element isolation trench T.

Next, as shown FIG. 5D, for example, reactive ion etching (RIE) or other etching is used to etch the element isolation layer 24, the first insulating film 21a, and the floating gate covering layer 26 until the position of the surface of the element isolation layer 24 becomes a position below the floating gate layer 30a by about half of its thickness and thereby form an element isolation insulating film 24a. In this etching, part of the sides and the top surface of the floating gate layer 30a are exposed.

Next, as shown in FIG. 5E, an inter-layer insulating film comprised of ONO film is formed covering the exposed surfaces of the floating gate layer 30a. Next, while not illustrated, photolithography is used to remove the inter-layer insulating film other than at the SA-STI cell memory cell portion. Next, a control gate (word line) 31 of a polycide structure comprised of a lower control gate 31a comprised for example of polycrystalline silicon and an upper control gate 31*b* comprised of tungsten silicide is formed covering the top surface of the inter-layer insulating film. The control gate is used as a mask to etch the floating gate layer 30*a* and the inter-layer insulating film to form a patterned floating gate 30*b* and inter-layer insulating film 25*a*.

Next, a gate electrode of the selection MOS transistor portion is formed and ions are implanted for formation of the source-drain diffusion regions, methods based on ordinary methods are used to form MOS transistors of the peripheral circuit portion of a NAND type flash memory, for example the CVD method is used to form an inter-layer insulating film 28 of silicon oxide, a contact hole BC reaching the drain diffusion layer 13' of the selection transistor is formed, a buried electrode 34 and bit line 35 and other interconnections are formed, a passivation film is deposited, a pad opening portion is formed, etc. to form a NAND type flash memory using SA-STI cells as shown in FIG. 3A and FIG. 3B. In FIG. 3A, the illustration of the element isolation trench covering 12 comprised of silicon oxide formed at the inner walls of the element isolation trench T shown in FIG. 5E is omitted.

Turning to the problems to be solved by the invention, the floating gate type semiconductor nonvolatile memory device having the above SA-STI cell structure sometimes suffers from the problems of a lower quality or difficulty in achieving higher integration due to the following problems:

For example, in the above semiconductor nonvolatile memory device, the capacitive coupling of the control gate and floating gate is obtained at the top surface and parts of the side walls of the floating gate. Therefore, if the memory cell area is further reduced, it ends up becoming difficult to secure the necessary capacitive coupling of the control gate and floating gate.

When the necessary capacitive coupling has not been reached, a normal write operation on the memory cell becomes difficult and the quality of the semiconductor nonvolatile memory device ends up falling. To ensure a normal operation, a large operating voltage becomes necessary when generating an FN current in the gate insulating film (tunnel insulating film) to write or erase memory cell data. Since this invites an increase in the area of the booster circuit for boosting the power source voltage to the operating voltage, higher integration of the device becomes difficult. This becomes a factor behind an increase in the chip cost. Further, time is required for boosting, so this also ends up becoming a factor behind a decline in the processing speed.

Further, for example, as shown in FIG. 5E, in the step for forming a control gate (word line) 31 of a polycide structure comprised of a lower control gate 31*a* comprised of polycrystalline silicon and an upper control gate 31*b* comprised of tungsten silicide at an upper layer of the inter-layer insulating layer, then using the control gate as a mask to etch the floating gate layer 30*a* and the inter-layer insulating film to form a patterned floating gate 30*b* and inter-layer insulating layer 25*a*, the following problems sometimes arise. In the sectional view along the line C–C' in FIG. 2A, in the above step, the control gate 31, inter-layer insulating film 25, and floating gate 30*a* are removed, but as shown in FIG. 6A, when the control gate 31 and the inter-layer insulating film 25 are removed from the state where the control gate 31 is formed, as shown in FIG. 6B, sometimes as far down as the element isolation insulating film 24*a* and element isolation trench covering film 12 end up being etched from the top surface. As a result, the surfaces of the element isolation insulating film 24*a* and the element isolation trench covering film 12 fall and parts of the side walls of the trench type element isolation trench T of the semiconductor substrate 10 are exposed. If the floating gate 30*a* is removed from this state, then the level as far down as the semiconductor substrate 10 ends up being etched from the exposed parts of the trench type element isolation trench T side walls of the semiconductor substrate 10 as shown in FIG. 6C. A depression V ends up being formed in the semiconductor substrate 10 and the quality of the semiconductor nonvolatile memory device ends up being reduced by a large extent.

SUMMARY OF THE INVENTION

An object of the present invention is to provide a semiconductor nonvolatile memory device using SA-STI cells improved in quality and suited for higher integration and a method of producing the same.

According to a first aspect of the present invention, there is provided a semiconductor nonvolatile memory device formed with a plurality of memory transistors, comprising a semiconductor substrate having in its surface a channel formation region in which a channel is formed; a trench formed in the semiconductor substrate so as to divide the channel formation region into a plurality of regions; an element isolation insulating film formed in the trench; a gate insulating film formed on the channel formation region; a first floating gate formed at an upper layer of the gate insulating film; second floating gates formed connected to the first floating gate at facing sides of the first floating gate; an inter-layer insulating film formed at an upper layer of the first floating gate and the second floating gates; a control gate formed at an upper layer of the inter-layer insulating film; and a source-drain region formed connected to the channel formation region.

The semiconductor nonvolatile memory device of the present invention forms a field effect transistor (memory transistor) having a floating gate covered by an insulating film between the control gate and the channel formation region in the semiconductor substrate. If a suitable voltage is applied to the control gate, semiconductor substrate, or source-drain region etc., a Fowler-Nordheim type tunnel current is generated, a charge is injected into the floating gate, or a charge is released from the floating gate to the semiconductor substrate. If a charge is stored in the floating gate in this way, a field is generated due to the stored charge so the threshold voltage of the transistor changes. This changes makes it possible to store data.

The above semiconductor nonvolatile memory device has an element isolation insulating film formed by the SA-STI method and can therefore be reduced in cell area compared with element isolation using a LOCOS element isolation insulating film and is suited to higher integration. Further, since the floating gate has a first floating gate and second floating gates formed connected with the first floating gate at facing sides of the first floating gate, it is possible to increase the surface area contributing to the capacitive coupling ratio with the control gate compared with a floating gate of a conventional shape and to increase the capacitive coupling ratio of the control gate and the floating gate. Due to this, even if the area of the memory cell is reduced, it is possible to secure the necessary capacitive coupling ratio between the control gate and floating gate, prevent erroneous operations at the time of a write operation on a memory cell and a reduction in quality, reduce the operating voltage and the power source voltage, and suppress an increase in the area of the booster circuit and the boosting time.

Therefore, it is possible to provide a semiconductor nonvolatile memory device high in quality and improved In degree of integration.

The semiconductor nonvolatile memory device of the present invention preferably has a plurality of memory transistors connected in a series. A semiconductor nonvolatile memory device comprised of a plurality of NAND type or other memory transistors connected in series is advantageous for increasing the degree of integration. By increasing the number of the memory cells and increasing the area of the memory cell portion, it is possible to make the area of the bit line contact portion, the selection MOS transistor portion, and the source line portion added negligible in extent compared with the area of the memory cell portion and possible to obtain a semiconductor nonvolatile memory device of the highest degree of integration within the limits of the minimum feature size.

Preferably, the semiconductor substrate comprises an insulating film formed on a substrate and a semiconductor layer formed on the insulating film and having the channel formation region and the source-drain region. Due to this, it is possible to make a silicon (semiconductor) on insulator (SOI) structure semiconductor substrate and form a completely element-isolated semiconductor device.

Preferably, when the second floating gates are formed connected to the first floating gate at facing sides of the first floating gate, at least one top point of each of the second floating gates is formed higher than a top portion of the side of the first floating gate connected to it. Due to this, it is possible to obtain a floating gate with at least two facing ends formed higher than the area between the ends, increase the surface area of the floating gate contributing to the capacitive coupling ratio, and increase the capacitive coupling ratio between the control gate and the floating gate.

Preferably, a plurality of the memory transistors are connected in a series. Due to this, it is possible to form a semiconductor nonvolatile memory device of the highest degree of integration within the limit of the minimum feature size. Further, preferably the semiconductor substrate is provided with an insulating film formed on the substrate and, a semiconductor layer formed at an upper layer of the insulating film and having the channel formation region and the source-drain region. Due to this, it is possible to form a completely element-isolated semiconductor device using a semiconductor substrate of an SOI structure.

According to a second aspect of the present invention, there is provided a method of producing a semiconductor nonvolatile memory device comprising the steps of forming a gate insulating film on a semiconductor substrate having a channel formation region; forming a first floating gate at an upper layer of the gate insulating film; forming a mask layer at an upper layer of the first floating gate; forming an element isolation trench in the semiconductor substrate in a region sandwiched between first floating gates; forming an element isolation insulating film by burying an insulator in the element isolation trench; forming a pair of second floating gates connected to a first floating gate at least at facing sides of the first floating gate; removing the mask layer; forming an inter-layer insulating film on the first floating gate and the second floating gates; forming a control gate at an upper layer of the inter-layer insulating film; and forming a source-drain region connected to the channel formation region.

The method of producing the semiconductor nonvolatile memory device of the present invention comprises forming a gate insulating film on a semiconductor substrate having a channel formation region, forming a first floating gate at an upper layer of the gate insulating film, and forming a mask layer at an upper layer of the first floating gate. Next, it forms an element isolation trench in the semiconductor substrate in a region sandwiched between first floating gates and buries the element isolation trench by an insulator to form an element isolation insulating film. Next, it forms a pair of second floating gates connected with the first floating gate at least at facing side walls of the first floating gate. Next, it removes the mask layer, forms an inter-layer insulating film at an upper layer of the first floating gate and the second floating gate, forms a control gate at an upper layer of the inter-layer insulating film, and forms a source-drain region connected to the channel formation region.

According to the method of producing the semiconductor nonvolatile memory device of the present invention, by forming a floating gate comprised of the first floating gate and the pair of second floating gates connected with the first floating gate at the facing side walls of the first floating gate, it becomes possible to increase the surface area contributing to the capacitive coupling ratio with the control gate compared with a floating gate of the shape of the related art and possible to increase the capacitive coupling ratio between the control gate and the floating gate. Due to this, even if the memory cell area is reduced, it is possible to secure the required capacitive coupling ratio of the control gate and floating gate, prevent erroneous operations in a write operation on a memory cells etc. and a fall in quality, reduce the operating voltage and the power source voltage, and suppress an increase in the area of the booster circuit and boosting time.

Further, since a mask layer is formed at an upper layer of the first floating gate, it is possible to form second floating gates by the method of forming a second floating gate layer over the entire surface at an upper layer of the mask layer and removing the second floating gate layer leaving the portions covering the facing side walls of the first floating gate. It is easy to judge the end point when removing the second floating gate layer by making it the time when the mask layer is exposed and fluctuations in the amount of etching can be suppressed for stable production.

Further, in the step of processing the inter-layer insulating film in the pattern of the control gate, the second floating gate becomes a mask for protecting the wall portions of the semiconductor substrate side of the element isolation insulating film to prevent the exposure of parts of the side walls of the element isolation trench formed in the semiconductor substrate, so it becomes possible to prevent etching down to the semiconductor substrate in the step of processing the floating gate in the pattern of the control gate.

Therefore, it becomes possible to produce a semiconductor nonvolatile memory device high in quality and suited for higher integration.

Preferably, the step of forming the element isolation insulating film includes a step of forming an insulator over the entire surface burying the element isolation trench and a step of removing the insulator leaving at least a part thereof buried in the inside of the element isolation trench. Due to this, it is possible to form a trench-type element isolation insulating film by the SA-STI method and possible to reduce the cell area.

Preferably, the step of forming the second floating gates includes a step of forming a second floating gate layer over the entire surface at an upper layer of the mask layer and a step of removing the second floating gate layer leaving at least the parts thereof covering the facing sides of the first floating gate. Due to this, it is possible to easily form a floating gate comprising a first floating gate and a pair of second floating gates connected to the first floating gate at the facing side walls of the first floating gate. Further, since a mask layer is formed at an upper layer of the first floating gate, it is easy to judge the end point when removing the second floating gate layer by making it the time when the mask layer is exposed and fluctuations in the amount of etching can be suppressed for stable production.

Preferably, the step of forming the second floating gates includes a step of forming a second floating gate layer over the entire surface at an upper layer of the mask layer and a step of removing the second floating gate layer leaving the parts thereof covering the facing sides of the mask layer and the first floating gate. Due to this, it becomes possible to make second floating gates higher than the first floating gate by the amount of thickness of the mask layer and increase the surface area contributing to the capacitive coupling ratio.

Preferably, further provision is made, after the step of forming the element isolation trench and before the step of forming the element isolation insulating film, a step of forming a covering film on the surface of the element isolation trench. Due to this, it is possible to remove damage at the time of formation of the element isolation trench and protect the edges of the gate insulating film.

BRIEF DESCRIPTION OF THE DRAWINGS

These and other objects and features of the present invention will become clearer from the following description given with reference to the attached drawings, in which:

FIG. 2A is a plan view of a semiconductor nonvolatile memory device according to a second related art and FIG. 2B is an equivalent circuit diagram of the same;

FIG. 4A to FIG. 4C are sectional views of the steps of production in a method of producing a semiconductor nonvolatile memory device according to the second related art, wherein FIG. 4A is a view up to the step of formation of a first insulating film, FIG. 4B is a view up to the step of formation of a channel stopping layer, and FIG. 4C is a view up to the step of formation of an element isolation layer;

FIG. 5D and FIG. 5E are sectional views of the steps after FIG. 4A to FIG. 4C, wherein FIG. 5D is a view up to the step of formation of the element isolation film and FIG. 5E is a view up to the step of formation of a control gate;

FIG. 6A to FIG. 6C show the steps for processing of the inter-layer insulating film and floating gate at the pattern of a control gate in FIG. 5E, wherein FIG. 6A is a view up to the step of formation of the control gate, FIG. 6B is a view up to the step of removal of the inter-layer insulating film, and FIG. 6C is a view up to the step of removal of the floating gate;

FIG. 9A to FIG. 9C are sectional views of the steps of production in a method of producing a semiconductor nonvolatile memory device according to a first embodiment of the present invention, wherein FIG. 9A is a view up to the step of formation of a first floating gate layer, FIG. 9B is a view up to the step of patterning the first floating gate layer, and FIG. 9C is a view up to the step of forming an element isolation trench;

FIG. 10D to FIG. 10F are sectional views of the steps after FIG. 9A to FIG. 9C, wherein FIG. 10D is a view up to the step of formation of an element isolation trench covering film, FIG. 10E is a view up to the step of formation of the element isolation layer, and FIG. 10F is a view up to the step of formation of the element isolation insulating film;

FIG. 11G to FIG. 11I are sectional views of the steps after FIG. 10D to FIG. 10F, wherein FIG. 11G is a view up to the step of formation of a second floating gate layer, FIG. 11H is a view up to the step of processing of the second floating gate layer, and FIG. 11I is a view up to the step of formation of a control gate;

FIG. 12A to FIG. 12C are views of the steps of processing of the inter-layer insulating film and floating gate at the pattern of a control gate in FIG. 11I, wherein FIG. 12A is a view up to the step of formation of the control gate, FIG. 12B is a view up to the step of removal of the inter-layer insulating film, and FIG. 12C is a view up to the step of removal of the floating gate;

FIG. 14A to FIG. 14C are sectional views of the steps of production in a method of producing a semiconductor nonvolatile memory device according to a second embodiment of the present invention, wherein FIG. 14A is a view up to the step of formation of a mask layer, FIG. 14B is a view up to the step of patterning the first floating gate layer, and FIG. 14C is a view up to the step of forming an element isolation trench;

FIG. 15D to FIG. 15F are sectional views of the steps after FIG. 14A to FIG. 14C, wherein FIG. 15D is a view up to the step of formation of an element isolation trench covering film, FIG. 15E is a view up to the step of formation of the element isolation layer, and FIG. 15F is a view up to the step of formation of the element isolation insulating film;

FIG. 16G to FIG. 16I are sectional views of the steps after FIG. 15D to FIG. 15F, wherein FIG. 16G is a view up to the step of formation of a second floating gate layer, FIG. 16H is a view up to the step of processing of the second floating gate layer, and FIG. 16I is a view up to the step of formation of a control gate;

FIG. 18A to FIG. 18C are sectional views of the steps of production in a method of producing a semiconductor nonvolatile memory device according to a third embodiment of the present invention, wherein FIG. 18A is a view up to the step of formation of a mask layer, FIG. 18B is a view up to the step of patterning the first floating gate layer, and FIG. 18C is a view up to the step of forming an element isolation trench;

FIG. 19D to FIG. 19F are sectional views of the steps after FIG. 18A to FIG. 18C, wherein FIG. 19D is a view up to the step of removal of the resist film, FIG. 19E is a view up to the step of formation of an element isolation trench covering film, and FIG. 19F is a view up to the step of formation of the element isolation layer;

FIG. 20G to FIG. 20I are sectional views of the steps after FIG. 19D to FIG. 19F, wherein FIG. 20G is a view up to the step of formation of an element isolation insulating film, FIG. 20H is a view up to the step of formation of a second floating gate layer, and FIG. 20I is a view up to the step of processing of the second floating gate layer;

FIG. 21J and FIG. 21K are sectional views of the steps after FIG. 20G to FIG. 20I, wherein FIG. 21J is a view up to the step of removal of the mask layer and FIG. 21K is a view up to the step of formation of the control gate; and FIG. 22A to FIG. 22C are views of the steps of processing of the inter-layer insulating film and floating gate at the pattern of a control gate in FIG. 21K, wherein FIG. 22A is a view up to the step of formation of the control gate, FIG. 22B is a view up to the step of removal of the inter-layer insulating film, and FIG. 22C is a view up to the step of removal of the floating gate.

DESCRIPTION OF THE PREFERRED EMBODIMENTS

Figure 1:
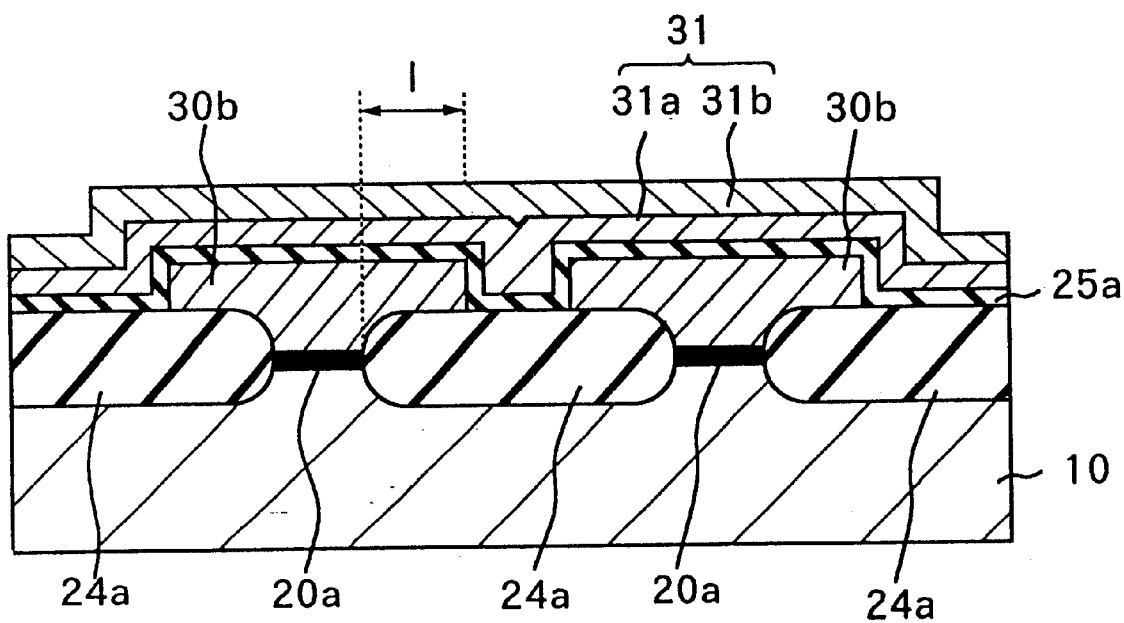
FIG. 1 is a sectional view of a semiconductor nonvolatile memory device according to a first related art.

Preferred embodiments of the present invention will be explained below with reference to the attached drawings. Note that constituent portions similar to the constituent portions in FIG. 1 to FIGS. 6A to 6C referred to in the description of the related art are given the same reference numerals.

First Embodiment

Figure 7A:
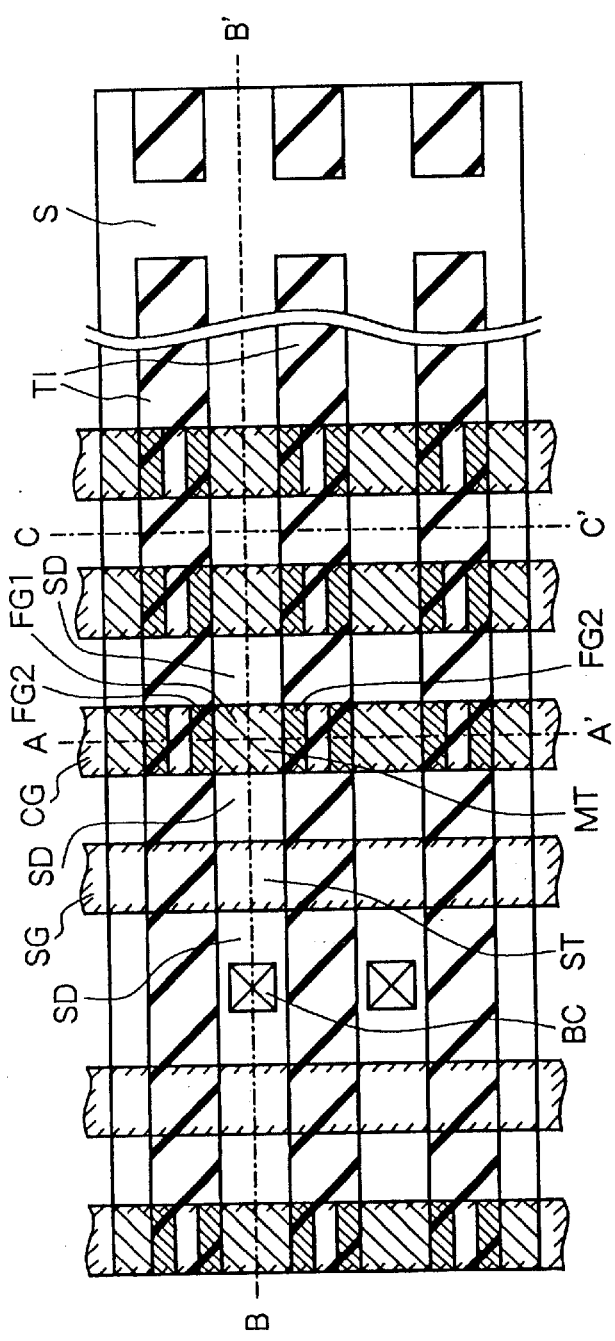
FIG. 7A is a plan view of a semiconductor nonvolatile memory device according to first to third embodiments of the present invention and FIG. 7B is an equivalent circuit diagram of the same.

A semiconductor nonvolatile memory device according to the first embodiment of the present invention is a NAND type flash memory using SA-STI cells. FIG. 7A is a plan view. A first floating gate FG1 is formed through a tunnel insulating film at an upper layer of a channel formation region of the semiconductor substrate at a region where an active region of the silicon semiconductor substrate isolated by a trench type element isolation insulating film TI intersects the control gate CG to form a word line. Further, a second floating gate FG2 is formed on an element isolation insulating film T1 connected to a side wall of the first floating gate in the interconnection direction of the control gate CG. The floating gate comprised of the first floating gate FG1 and the second floating gate FG2 is covered by an insulating film and a control gate CG is formed at an upper layer thereof. Further, source-drain diffusion regions SD are formed in the substrate at the two sides of the control gate CG. A plurality of field effect transistors configured having floating gates covered by an insulating film between the control gate CG and the channel formation region in the semiconductor substrate, that is, memory transistors MT, are connected in series to form a NAND column. A selection MOS transistor ST for selecting the NAND column is formed at one end of the NAND column and has a drain diffusion layer connected through a bit contact BC to a not shown bit line. A not shown selection MOS transistor is also formed at the other end of the NAND column and has a source diffusion layer connected to the source line S.

Figure 7B:
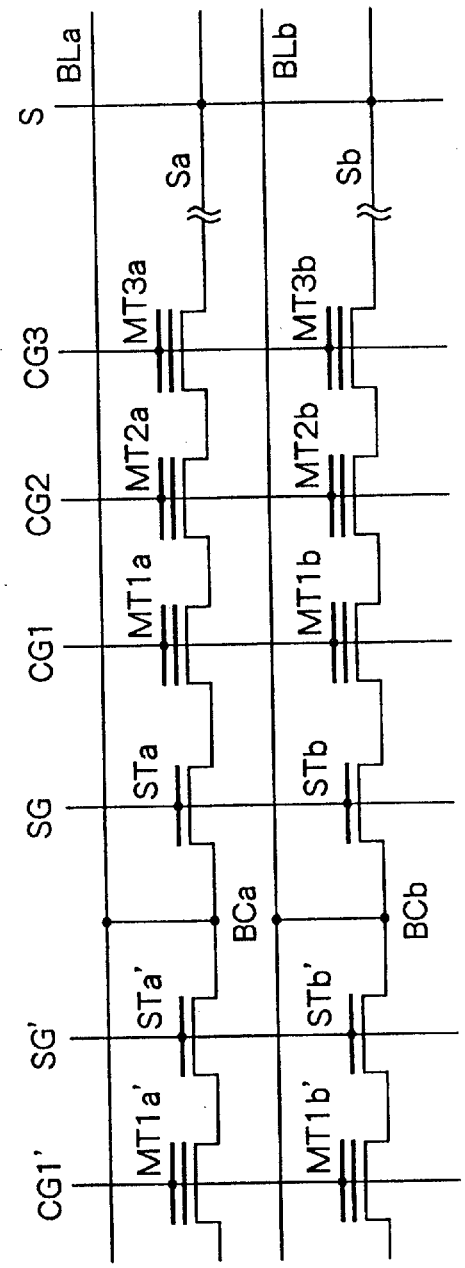

An equivalent circuit diagram of the semiconductor nonvolatile memory device shown in the plan view of FIG. 7A is shown in FIG. 7B. Memory transistors (MT1a, MT2a, MT3a, . . . ) are connected in series to form a NAND column. A selection MOS transistor STa for selecting the NAND column is formed at one end of the NAND column and has a drain diffusion layer connected through the bit contact BCa to the bit line BLa. A (not shown) selection MOS transistor is formed at the other end of the NAND column and has a source diffusion layer connected through a sub source line Sa to a main source line S. Another NAND column comprised of a memory transistor MT1a' selectable by a selection MOS transistor STa', is also connected to the bit line BLa. On the other hand, memory transistors (MT1b, MT2b, MT3b, . . . ) are connected in series to form a NAND column. A selection MOS transistor STb for selection of this NAND column is formed at one end of this NAND column and has a drain diffusion layer connected through the bit contact BCb to the bit line BLb. The source-diffusion layer of a (not shown) selection MOS transistor formed at the other end of the NAND column is connected through a sub source line Sb to the main source line S.

Figure 8A:
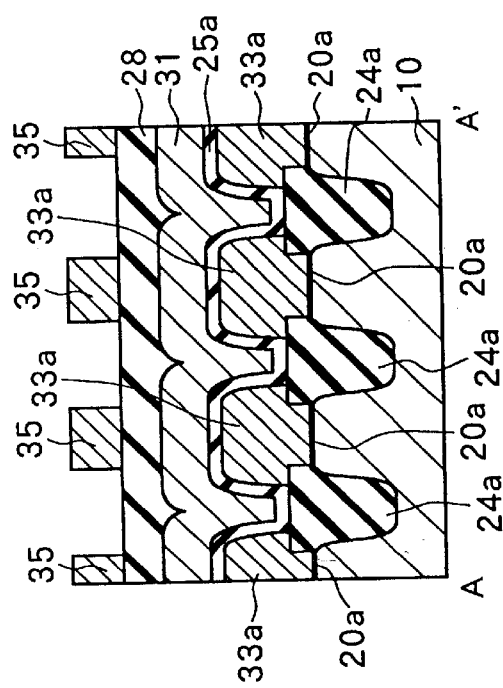
FIG. 8A is a sectional view along the line A–A' of FIG. 7A of the semiconductor nonvolatile memory device according to the first embodiment and FIG. 8B is a sectional view along the line B–B' of FIG. 7A.
Figure 8B:
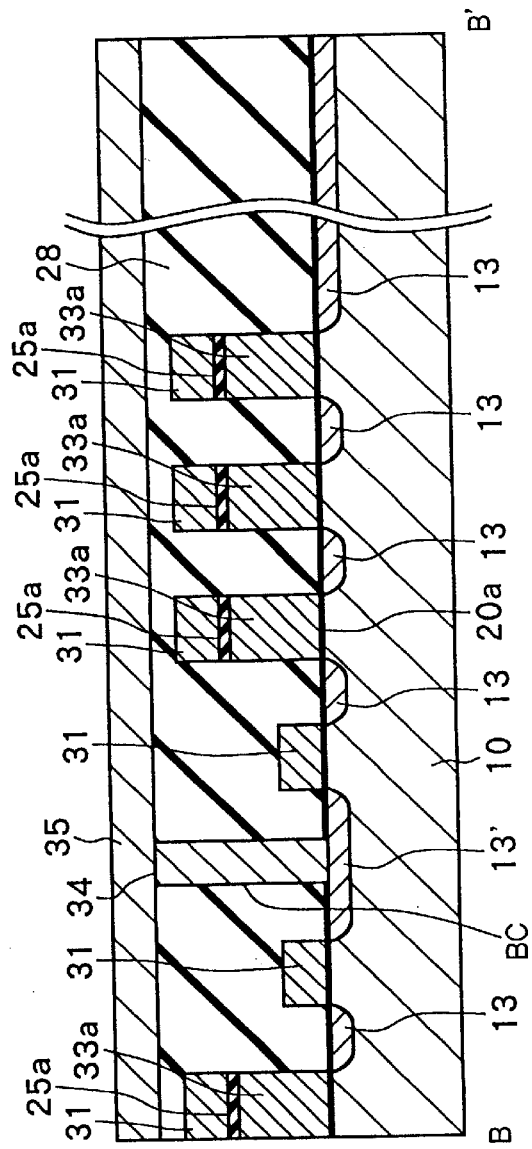

A sectional view along the line A–A' in FIG. 7A of the semiconductor nonvolatile memory device is shown in FIG. 8A and a sectional view along the line B–B' is shown in FIG. 8B. As shown in FIG. 8A, a gate insulating film (tunnel insulating film) 20a comprised of for example, a thin film of silicon oxide is formed on an active region of the semiconductor substrate 10 isolated by a trench type element isolation insulating film 24a. A floating gate 33a comprised of for example polycrystalline silicon is formed at the upper layer. Here, the floating gate 33a is shaped formed with a pair of protruding portions (second floating gates) formed connected to the two side walls in the interconnection direction of the control gate 28 as compared with the floating gate (first floating gate) of the related art shown in FIG. 3A. Further, an inter-layer insulating film 25a comprised of for example an ONO film is formed at an upper layer of the floating gate 33a. A control gate (word line) 31 covering the upper surface of the inter-layer insulating film 25a and comprised of for example polycrystalline silicon is formed. Further, as shown in FIG. 8B, source-drain diffusion layers 13 are formed in the semiconductor substrate 10 at the two sides of a control gate 31. Due to this, a field effect transistor having a floating gate 33a covered by an insulating film between the control gate 31 and the channel formation region in the semiconductor substrate 10 is formed. The transistors are connected in series in a NAND format to form a NAND column.

A selection transistor formed with a control gate 31 of the memory cell as a gate electrode for example is connected to one end of the NAND column. The selection transistor and the memory transistors constituting the NAND column are for example covered by an inter-layer insulating film 28 comprised of for example silicon oxide. The inter-layer insulating film 28 has a bit contact hole BC formed in it reaching the drain diffusion region 13' of the selection transistor and is connected through a buried electrode 34 to a bit line 35 comprised for example of aluminum. Further, a (not shown) selection transistor is connected to the other end of the NAND column and has a source diffusion layer connected to a source line formed for example as a diffusion layer in the semiconductor substrate 10.

In the above semiconductor nonvolatile memory device, as shown in FIG. 8A, the element isolation region is formed by the so-called self-aligned shallow trench isolation (SA-STI) method and is a structure suited to high integration. Further, the floating gate 33a is shaped formed with the pair of protruding portions (second floating gates) connected to the two side walls in the interconnection direction of the control gate 28 as compared with the floating gate (first floating gate) of the related art. The surface area contributing to the capacitive coupling ratio with the control gate can be increased from the floating gate of the shape of the related art and the capacitive coupling ratio of the control gate and floating gate can be increased. Due to this, it is possible to secure the necessary capacitive coupling ratio of the control gate and floating gate even if reducing the memory cell area, prevent erroneous operations in the write operation on a memory cell etc. and a reduction of the quality, reduce the operating voltage and power source voltage, suppress an increase in the area of the booster circuit and boosting time, and thereby realize a semiconductor nonvolatile memory device high in quality and improved in degree of integration.

Further, since this is a semiconductor nonvolatile memory device comprised of a plurality of memory transistors connected in series, it is advantageous for higher integration. By increasing the number of memory cells and increasing the area of the memory cell portion, it is possible to make the area of the bit line contact portion, selection MOS transistor portion, and source line portion added negligible in extent compared with the area of the memory cell portion and therefore possible to fabricate a semiconductor nonvolatile memory device with the highest degree of integration within the limit of the minimum feature size.

Figure 9A:
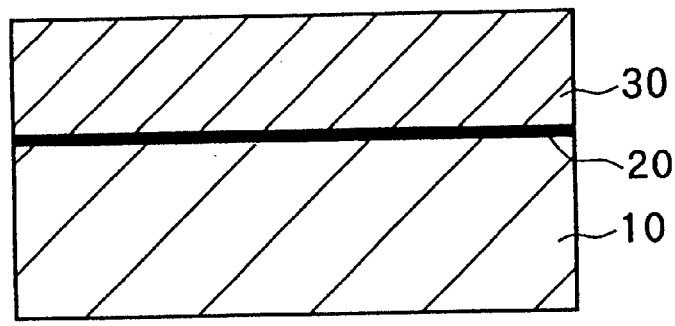

The method of producing the above semiconductor nonvolatile memory device will be explained with reference to a sectional view taken along the line A–A' in FIG. 7A. First, as shown in FIG. 9A, a gate insulating film 20 for forming the tunnel insulating film of a floating gate type MOS transistor is formed to a thickness of about 10 nm on the surface of the semiconductor substrate 10 on which is formed a P-type well etc. for isolation of the memory cell portion, peripheral circuit portion, etc. of a NAND type flash memory using for example the thermal oxidation method. Next, for example, the CVD method etc. is used to deposit an impurity-doped polycrystalline silicon film or amorphous silicon film to form a first floating gate layer 30.

Figure 9B:
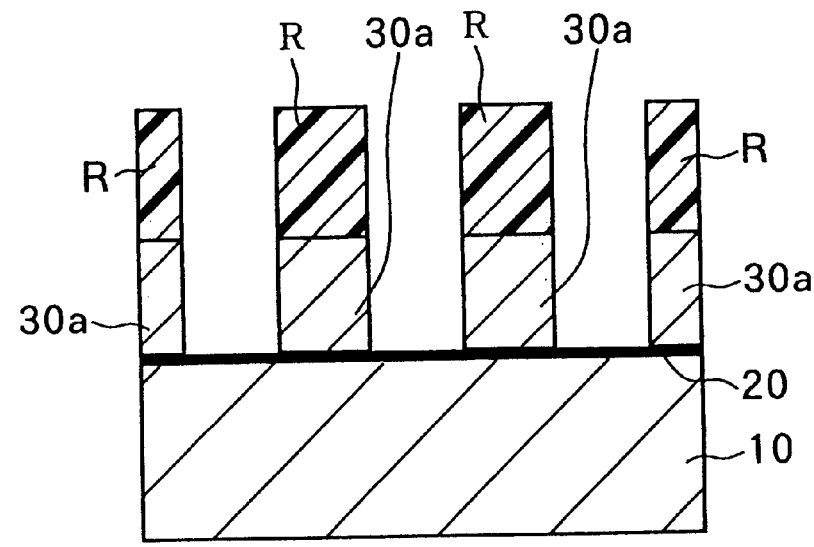

Next, as shown in FIG. 9B, photolithography is used to form a resist film R of a pattern of the floating gate at an upper layer of the floating gate layer 30, then for example, RIE or other dry etching is performed to pattern the first floating gate layer 30 to remove the first floating gate layer 30 at the element isolation region and form the first floating gate layer 30a covering the element region of the SA-STI cell.

Note that during the patterning of the first floating gate layer 30, the thin gate insulating film 20 under the first floating gate layer 30 of the element isolation region may also be etched in state.

Figure 9C:
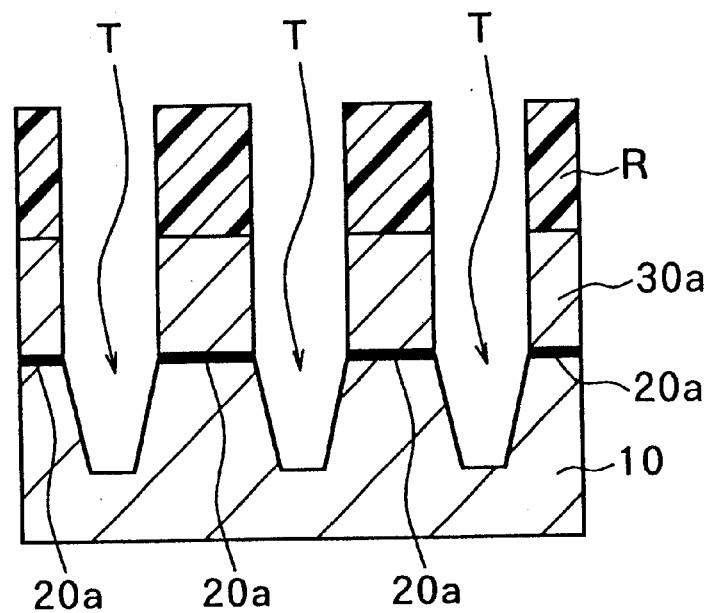

Next, as shown in FIG. 9C, the above resist film R is used as a mask for ECR plasma etching etc. to etch the gate insulating film 20 and the semiconductor substrate 10 at the element isolation region and form an element isolation trench T. At this time, to facilitate burying the element isolation trench T by an insulator in a later step, the element isolation trench T is preferably formed with a somewhat tapered shape.

Figure 10D:
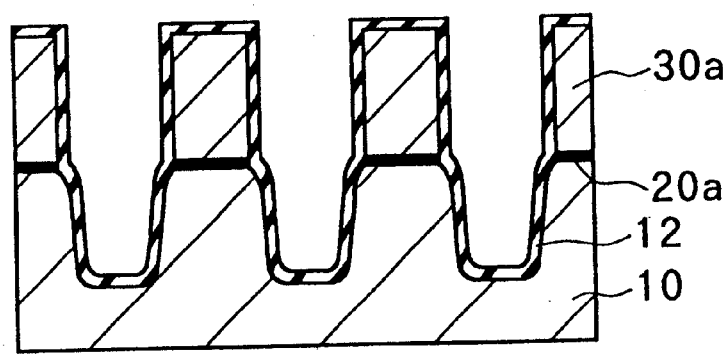

Next, as shown in FIG. 10D, the resist film R is peeled off, then the damage to the gate insulating film and the element isolation trench T surface portion at the time of formation of the element isolation trench T by the drying etching is removed by heat treatment in a nitrogen atmosphere and then thermal oxidation is performed to form an element isolation trench covering film 12 comprised of a thermal oxide film at the surface of the element isolation trench T. The thickness of the element isolation trench covering film 12 may be made for example about 10 to 30 nm, but to reduce the leakage current at the source-drain junction formed later, it is preferable to form it as thick as possible. Further, at the time of the thermal oxidation, the top surface and the side walls of the first floating gate layer 30a are also oxidized. Next, the ion implantation method may be used to, for Example, implant boron (B) ions and thereby form a (not shown) channel stopping layer at the bottom of the element isolation trench T of the element isolation region.

Figure 10E:
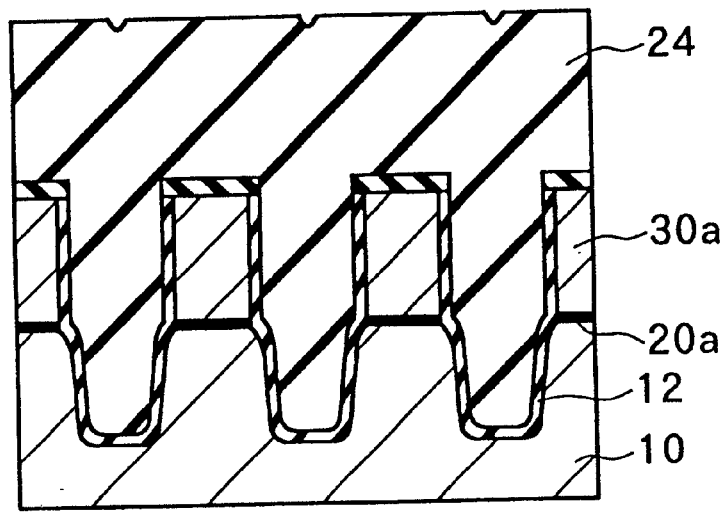

Next, as shown in FIG. 10E, for example, the voltage-application type CVD method or the conformal CVD method is used to deposit silicon oxide between the element isolation trench T portion and the first floating gate layer 30a to bury the same and form the element isolation layer 24. The thickness of the deposited element isolation layer 24 depends on the width of the element isolation trench T. A sufficient thickness is required for the film grown from the two walls of the element isolation trench T to be buried in the element isolation trench T.

Figure 10F:
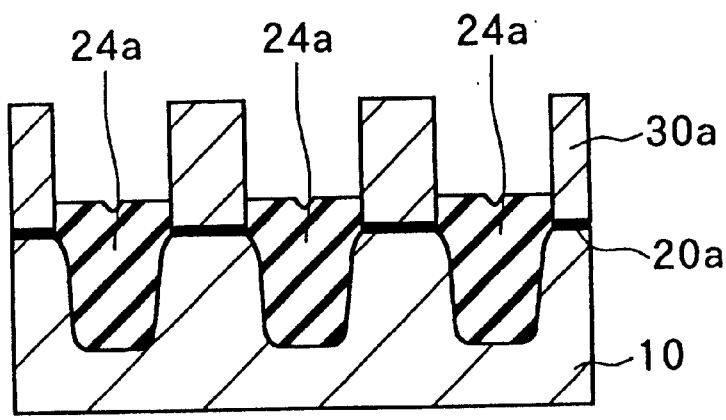

Next, as shown FIG. 10F, for example, wet etching or other etching is used for etching back to form an element isolation insulating film 24a buried in the element isolation trench T by self-alignment with the active region of the semiconductor substrate 10. At this time, the etching is stopped before the surface of the element isolation insulating film 24a becomes lower than the gate insulating film. Here, since the element isolation layer 24 and the element isolation trench covering film 12 are integral, the boundary is omitted in the illustration.

Figure 11G:
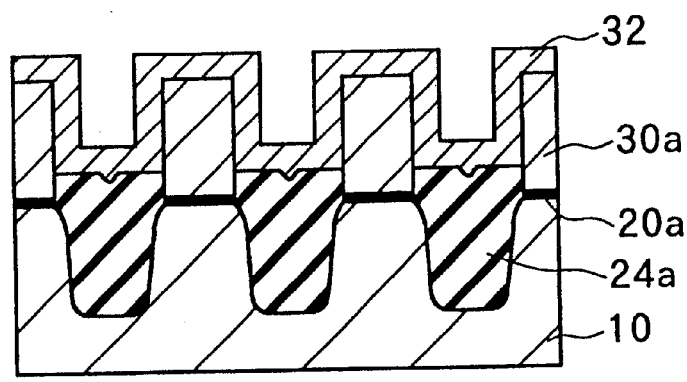

Next, as shown in FIG. 11G, for example the CVD method is used to deposit polycrystalline silicon or amorphous silicon over the entire surface to form the second floating gate layer 32.

Figure 11H:
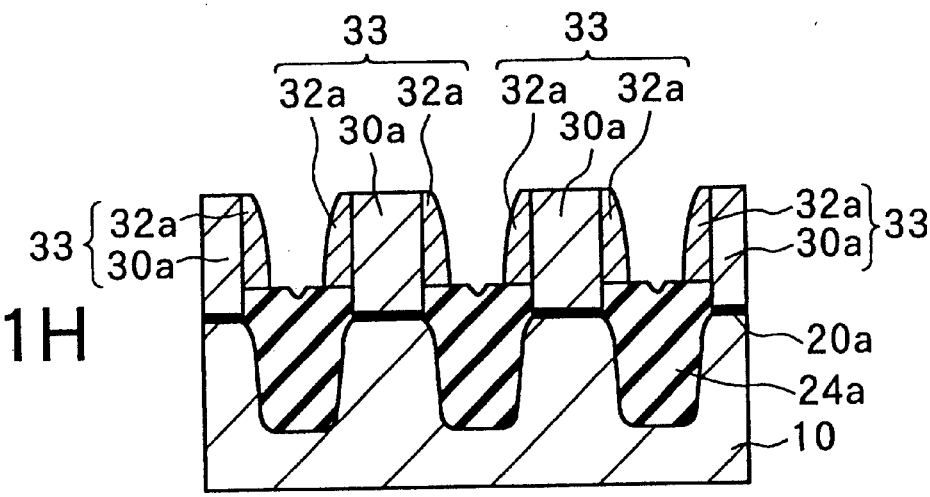

Next, as shown in FIG. 11H, for example, RIE or other etching is used to etch back the entire surface and remove the second floating gate layer 32 leaving the second floating gate layer 32 at the two side wall portions of the first floating gate layer 30a. Due to this, second floating gate layers 32a are formed connected to the first floating gate layer 30a at its two side walls. The first floating gate layer 30a and the second floating gate layer 32a form the floating gate layer 33.

Figure 11I:
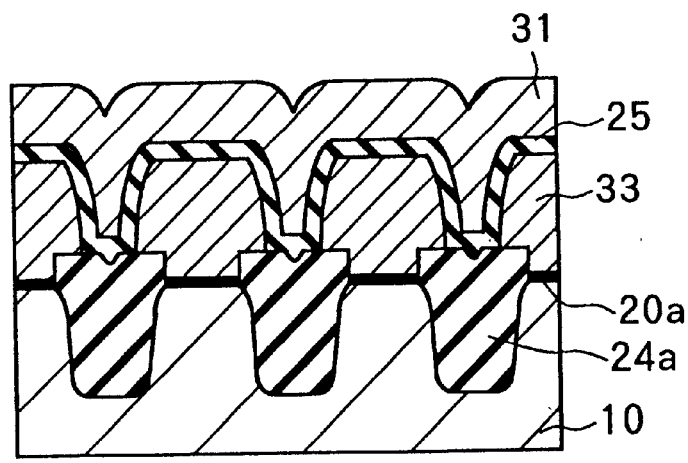

Next, as shown in FIG. 11I, an ONO film is formed to cover the floating gate layer 33 and make an inter-layer insulating film 25. Next, for example, a control gate (word line) 31 comprised of polycrystalline silicon is formed covering the top surface of the inter-layer insulating film 25. As the control gate 31, to lower the resistance, use may be made of a polycide structure such as a stacked structure of polycrystalline silicon and tungsten silicide. Here, as the thickness of the control gate 31, a thickness sufficient for burying the step difference formed by the floating gate is preferable to facilitate the later lithography step.

Next, the control gate 31 is used as a mask to etch the floating gate layer 33 and the inter-layer insulating film 25 to form a patterned floating gate 33a and the inter-layer insulating film 25a. Next, the gate electrodes are formed at the selection MOS transistor portion and the source-drain diffusion layers are formed by an ion implantation step, methods based on ordinary methods are used to form MOS transistors of the peripheral circuit portion of a NAND type flash memory, for example the CVD method is used to form an inter-layer insulating film 28 of silicon oxide, a contact hole BC reaching the drain diffusion layer 13' of the selection transistor is formed, a buried electrode 34 and bit line 35 and other interconnections are formed, a passivation film is deposited, a pad opening portion is formed, etc. to form a NAND type flash memory using SA-STI cells as shown in FIG. 8A and FIG. 8B.

Figure 3A:
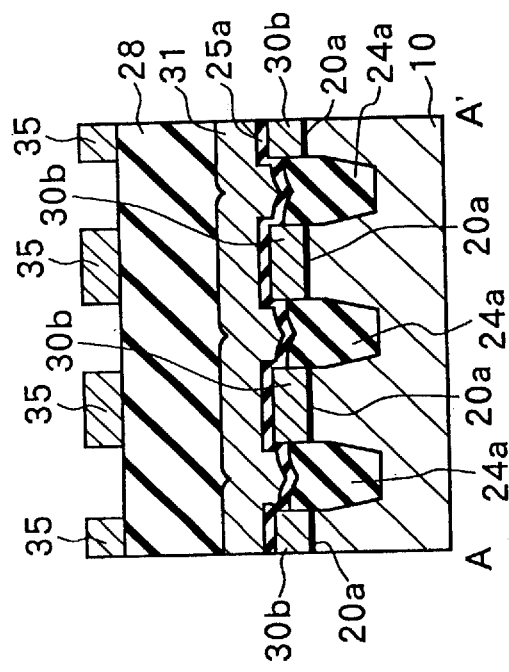
FIG. 3A is a sectional view along the line A–A' of FIG. 2A
Figure 3B:
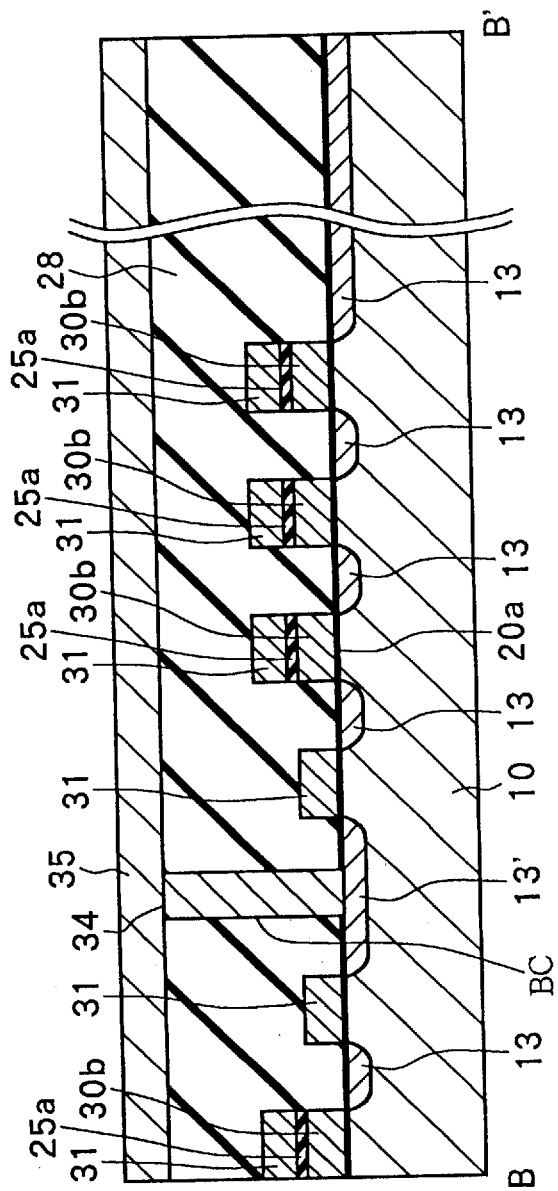
FIG. 3B is a sectional view along the line B–B' of FIG. 2A.
Figure 4A:
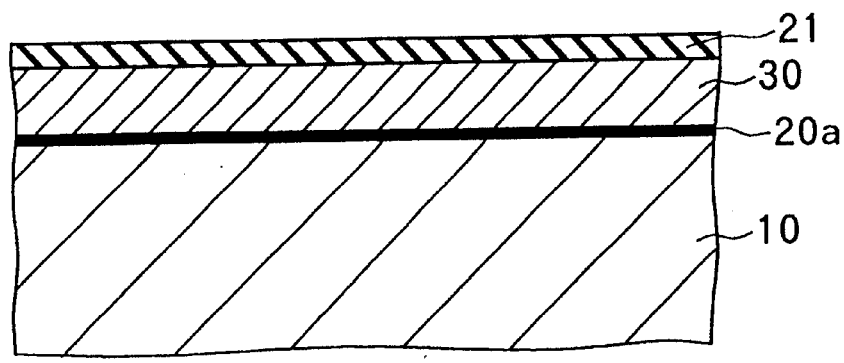
Figure 4B:
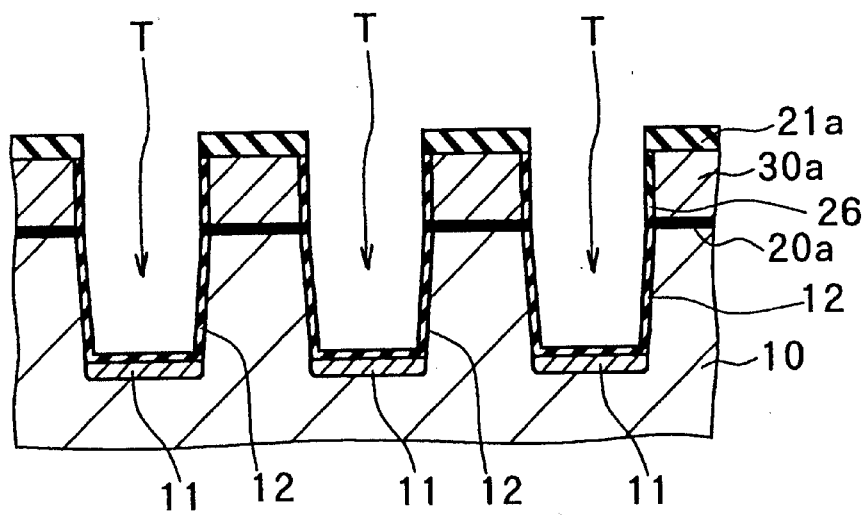
Figure 4C:
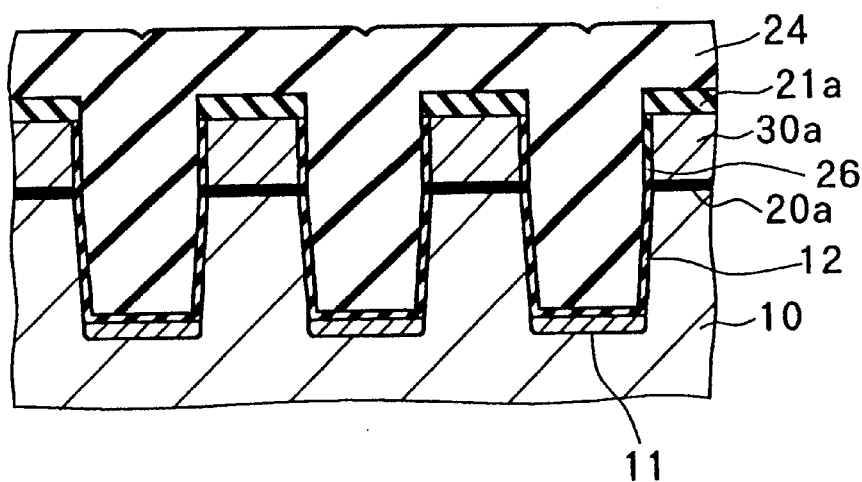
Figure 5D:
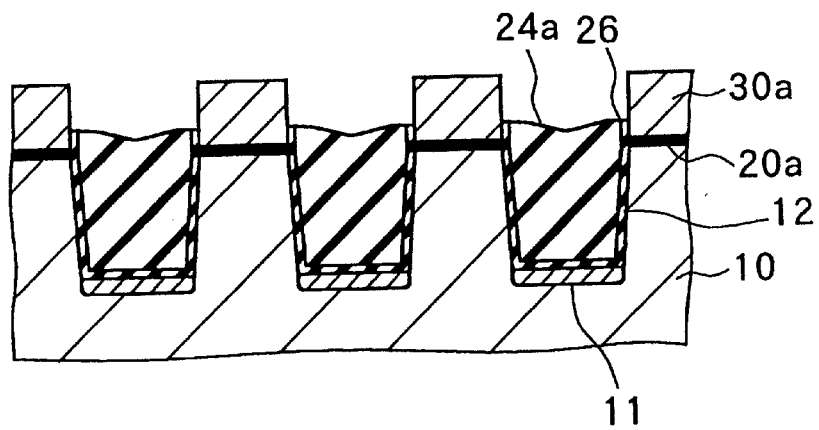
Figure 5E:
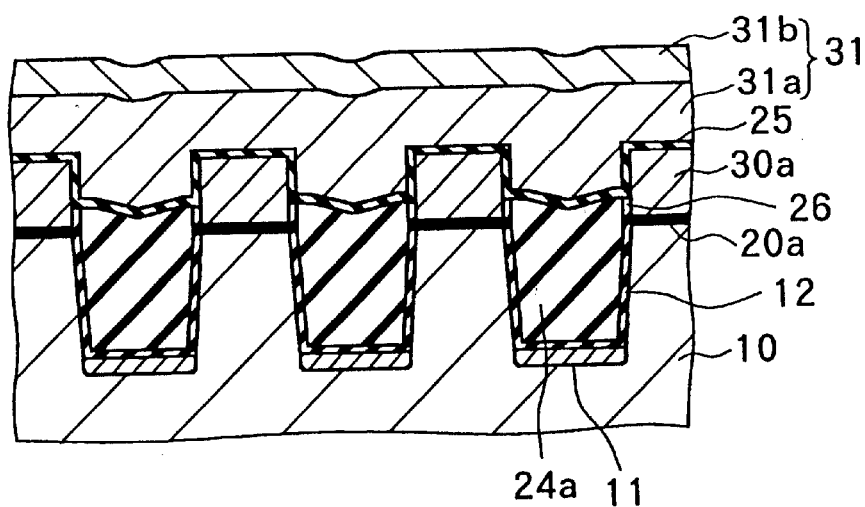
Figure 6A:
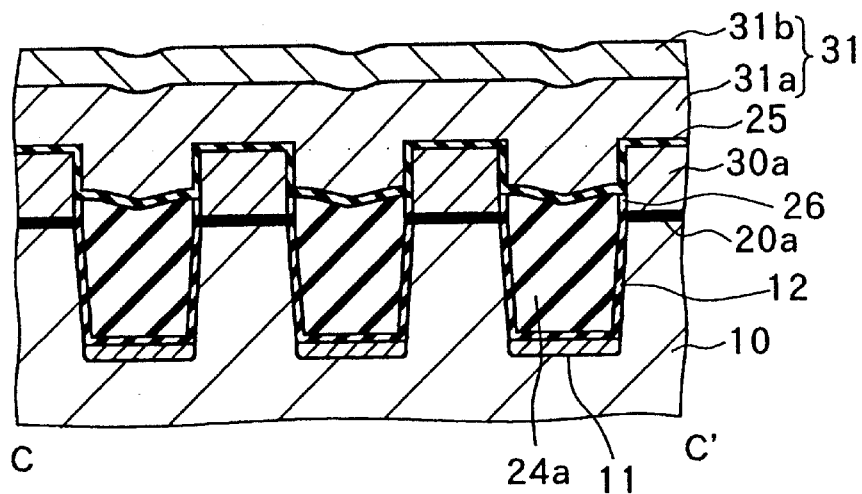
Figure 6B:
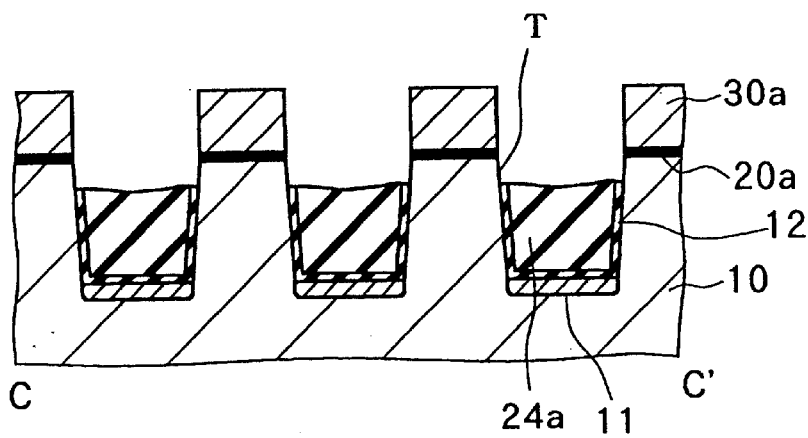
Figure 6C:
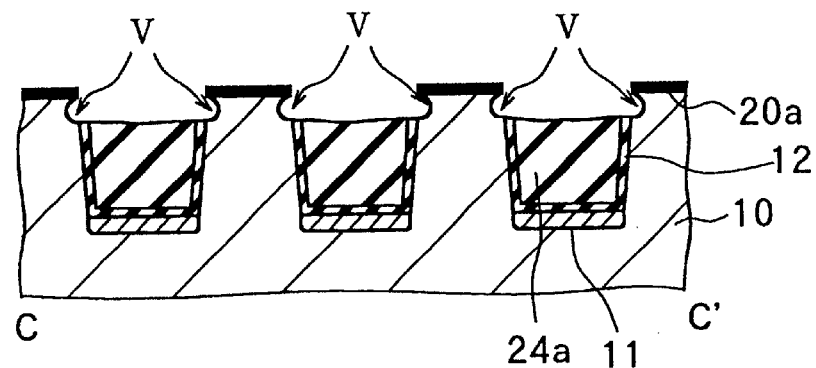

According to the method of producing the semiconductor nonvolatile memory device of the above embodiment, since, as the floating gate 33a, a pair of protruding portions (second floating gates) are formed connected to the two side walls in the interconnection direction of the control gate 28 compared with the floating gate (first floating gate) of the related art shown in FIG. 3A, it is possible to increase the surface area contributing to the capacitive coupling ratio with the control gate compared with a floating gate of a conventional shape and to increase the capacitive coupling ratio of the control gate and the floating gate. Due to this, even if the area of the memory cell is reduced, it is possible to secure the necessary capacitive coupling ratio between the control gate and floating gate, prevent erroneous operations in a write operation on a memory cell and a reduction in quality, reduce the operating voltage and the power source voltage, and suppress an increase in the area of the booster circuit and the boosting time, and thereby enable producing a semiconductor nonvolatile memory device high in quality and improved in degree of integration.

Figure 12A:
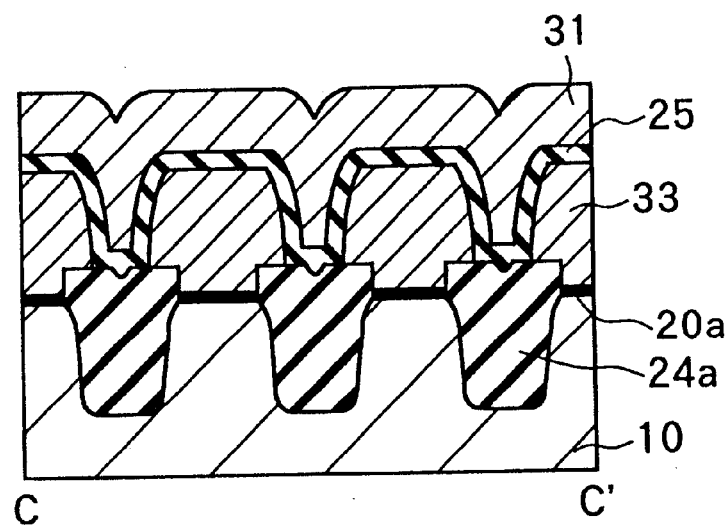
Figure 12B:
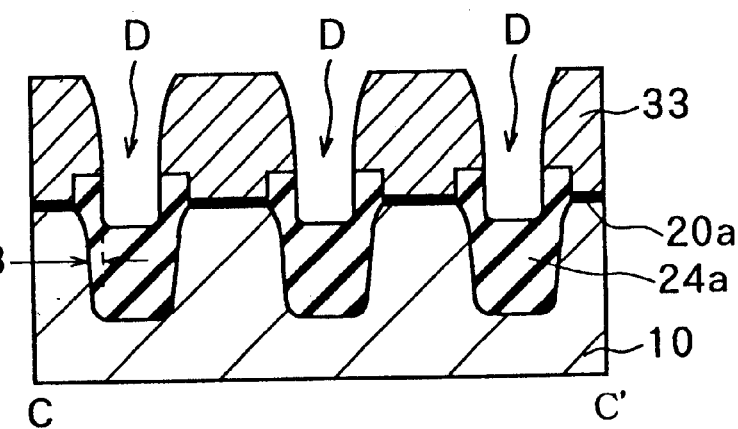
Figure 12C:
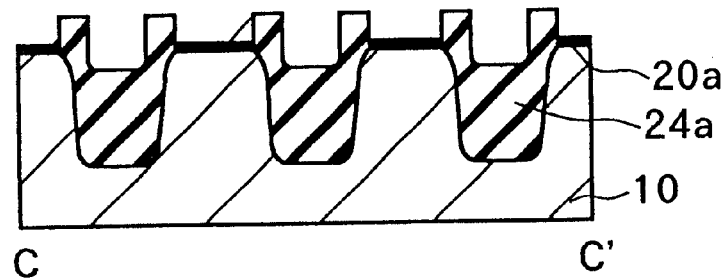

Further, as shown in FIG. 11I, in the step of forming the control gate (word line) 31 at the upper layer of the inter-layer insulating film, then using the control gate as a mask and etching the floating gate layer 30a and inter-layer insulating film 25 for patterning, in the sectional view taken along the line C–C' in FIG. 7A, the control gate 31, inter-layer insulating film 25, and floating gate 30a are removed, but as shown in FIG. 12A, when the control gate 31 and the inter-layer insulating film 25 are removed from the state of formation of the control gate 31, as shown in FIG. 12B, the second floating gates formed connected to the two side walls in the interconnection direction of the control gate are shaped protruding out from the walls of the semiconductor substrate 10 side of the element isolation insulating film 24a by the amount of the distance W3 with respect to the first floating gate and serve as masks for protection of the wall portions. Even if part of the element isolation insulating film 24a is removed and an indentation D is formed, it is possible to prevent exposure of parts of the side walls of the element isolation trench formed in the semiconductor substrate 10. Therefore, as shown in FIG. 12C, even if the floating gate 30a is removed, it is possible to prevent etching down to the semiconductor substrate 10. In the above way, it is possible to produce a semiconductor nonvolatile memory device high in quality and improved in degree of integration.

Second Embodiment

The semiconductor nonvolatile memory device according to the second embodiment of the present invention is a NAND type flash memory using SA-STI cells in the same way as the first embodiment. FIG. 7A and FIG. 7B are a plan view and equivalent circuit diagram of the same. The configuration is similar to that of the first embodiment and therefore an explanation will be omitted.

Figure 13A:
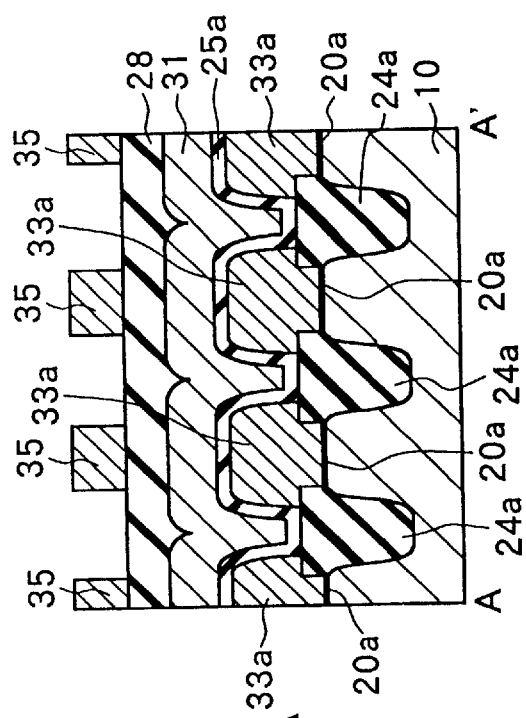
FIG. 13A is a sectional view along the line A'–A' of FIG. 7A of the semiconductor nonvolatile memory device according to the second embodiment and FIG. 13B is a sectional view along the line B–B' of FIG. 7A.
Figure 13B:
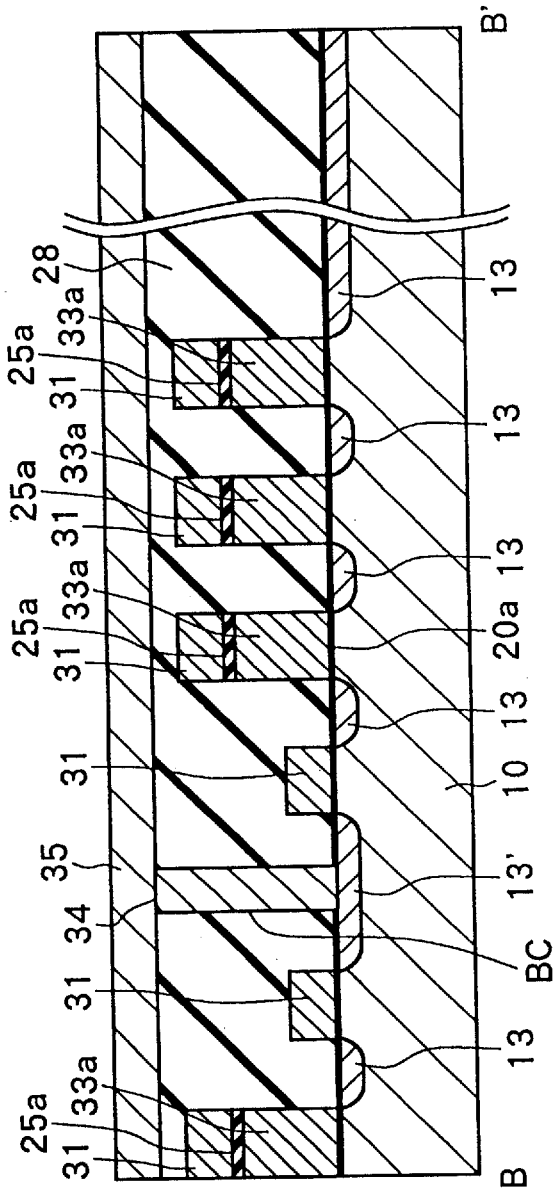

A sectional view along the line A–A' in FIG. 7A of the semiconductor nonvolatile memory device is shown in FIG. 13A and a sectional view along the line B–B' is shown in FIG. 13B. The configuration is substantially the same as the semiconductor nonvolatile memory device of the first embodiment and therefore an explanation will be omitted.

Figure 14A:
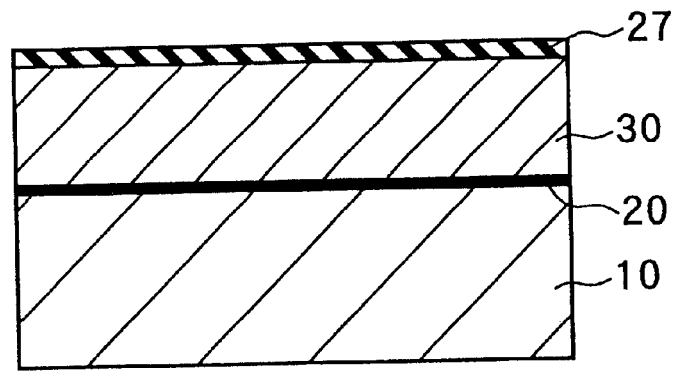

The method of producing the above semiconductor non-volatile memory device will be explained with reference to a sectional view taken along the line A–A' in FIG. 7A. First, as shown in FIG. 14A, a gate insulating film 20 for forming the tunnel insulating film of a floating gate type MOS transistor is formed to a thickness of about 10 nm on the surface of the semiconductor substrate 10 on which is formed a P-type well etc. for isolation of the memory cell portion, peripheral circuit portion, etc. of a NAND type flash memory using for example the thermal oxidation method. Next, for example, the CVD method etc. is used to deposit an impurity-doped polycrystalline silicon film or amorphous silicon film to a thickness of about 300 to 400 nm to form a first floating gate layer 30, then for example the CVD method etc. is used to deposit a silicon nitride film to a thickness of about 10 to 30 nm to form the mask layer 27. Here, as the mask layer 27, any material may be used enabling a selective etching rate between the polycrystalline silicon or amorphous silicon of the floating gate material and the silicon nitride of the later mentioned element isolation insulating film material. These materials are not limited to silicon nitride.

Figure 14B:
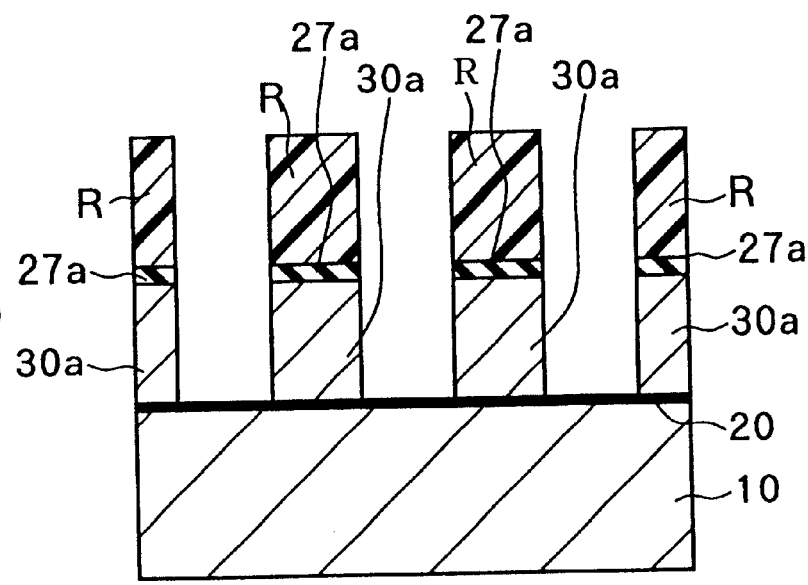

Next, as shown in FIG. 14B, photolithography is used to form a resist film R of a pattern of the floating gate at an upper layer of the mask layer 27, then for example, RIE or other dry etching is performed to pattern the mask layer 27/first floating gate layer 30 to remove the mask layer 27/first floating gate layer 30 at the element isolation region and form the mask layer 27a and first floating gate layer 30a covering the element region of the SA-STI cell.

Note that during the patterning of the mask layer 27/first floating gate layer 30, the thin gate insulating film 20 under the first floating gate layer 30 of the element isolation region may also be etched in state.

Figure 14C:
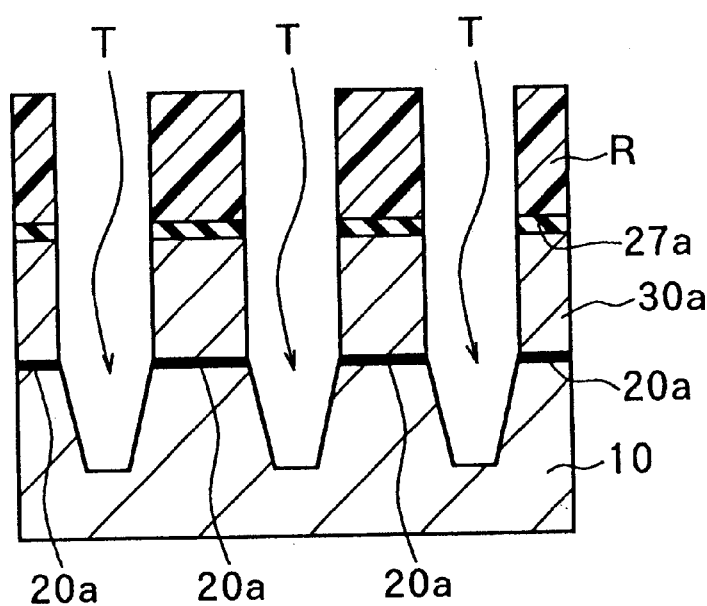

Next, as shown in FIG. 14C, the above resist film R is used as a mask for ECR plasma etching etc. to etch the gate insulating film 20 and the semiconductor substrate 10 at the element isolation region and form the element isolation trench T. At this time, to facilitate burying the element isolation trench T by an insulator in a later step, the element isolation trench T is preferably formed with a somewhat tapered shape.

Figure 15D:
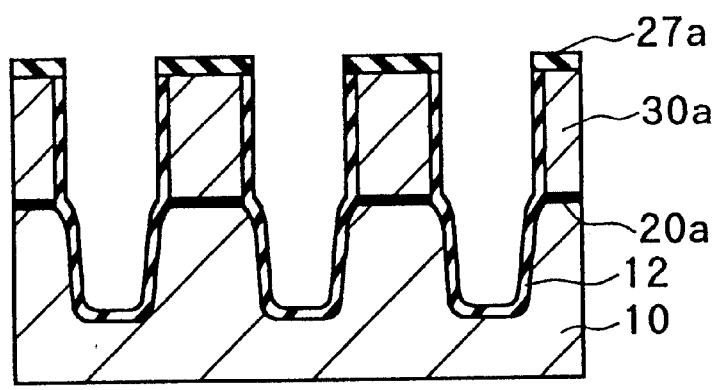

Next, as shown in FIG. 15D, the resist film R is peeled off, then the damage to the gate insulating film 20a and the element isolation trench T surface portion at the time of formation of the element isolation trench T by the dry etching is removed by heat treatment in a nitrogen atmosphere and then thermal oxidation is performed to form an element isolation trench covering film 12 comprised of a thermal oxide film at the surface of the element isolation trench T. The thickness of the element isolation trench covering film 12 may be made for example about 10 to 30 nm, but to reduce the leakage current at the source-drain junction formed later, it is preferable to form it as thick as possible. Further, at the time of the thermal oxidation, the side walls of the first floating gate layer 30a are also oxidized. Next, the ion implantation method may be used to for example implant boron (B) ions and thereby form a (not shown) channel stopping layer at the bottom of the element isolation trench T of the element isolation region.

Figure 15E:
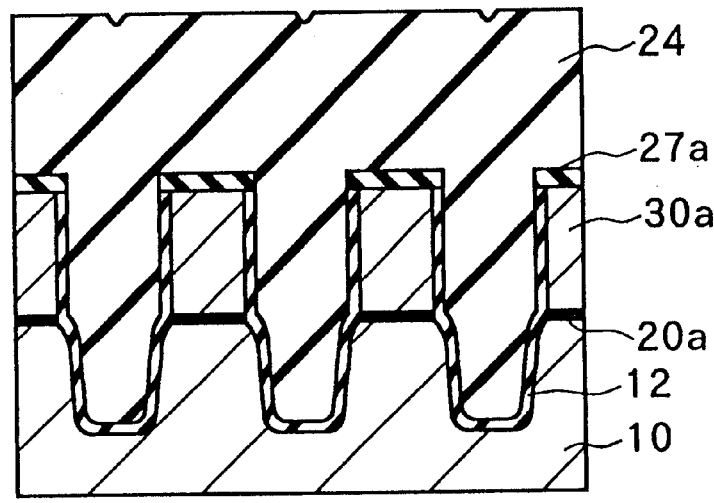

Next, as shown in FIG. 15E, for example, the voltage-application type CVD method or the conformal CVD method is used to deposit silicon oxide between the element isolation trench T portion and the first floating gate layer 30a to bury the same and form the element isolation layer 24. The thickness of the deposited element isolation layer 24 depends on the width of the element isolation trench T. A sufficient thickness is required for the film grown from the two walls of the element isolation trench T to be buried in the element isolation trench T.

Figure 15F:
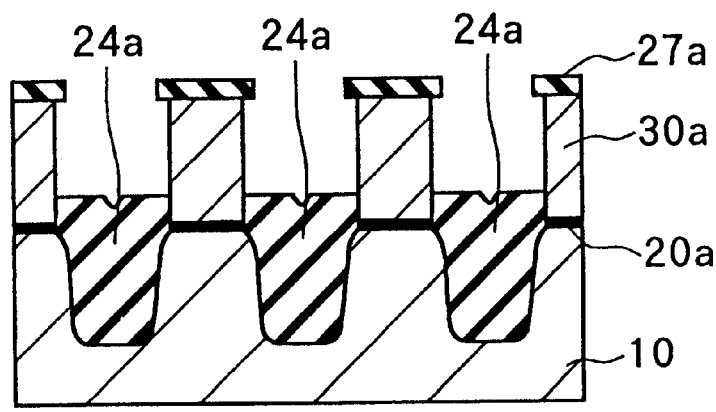

Next, as shown FIG. 15F, for example, fluoric acid based wet etching is used for etching back an element isolation layer 24 having selectivity with respect to the mask layer of silicon nitride and first floating gate layer 30a of polycrystalline silicon etc. and form an element isolation insulating film 24a buried in the element isolation trench T by self-alignment with the active region of the semiconductor substrate 10. If the above selectivity can be obtained, dry etching may also be performed. At this time, the etching is stopped at a position where the surface of the element isolation insulating film 24a is lower than the lower surface of the mask layer 27a and higher than the gate insulating film 20a. Here, since the element isolation layer 24 and the element isolation trench covering film 12 are integral, the boundary is omitted in the illustration.

Figure 16G:
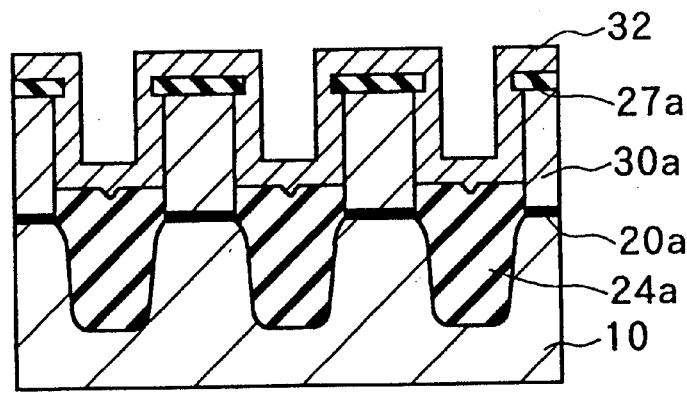

Next, as shown in FIG. 16G, for example the CVD method is used to deposit polycrystalline silicon or amorphous silicon over the entire surface to form the second floating gate layer 32.

Figure 16H:
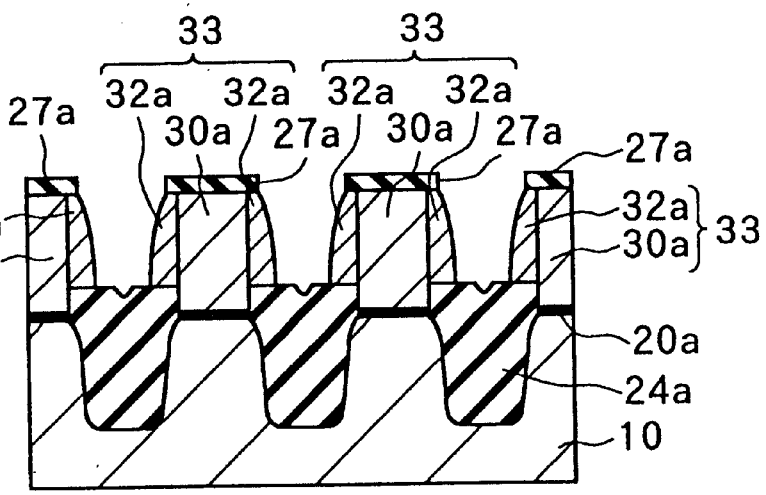

Next, as shown in FIG. 16H, for example, RIE or other etching is used to etch back the entire surface and remove the second floating gate layer 32, leaving the second floating gate layer 32 at the two side wall portions of the first floating gate layer 30a. Due to this, second floating gate layers 32a are formed connected to the first floating gate layer 30a at its two side walls. The first floating gate layer 30a and the second floating gate layer 32a form the floating gate layer 33. In this way, since the second floating gate layer 32a is formed by the method of forming the second floating gate layer 32 over the entire surface at an upper layer of the mask layer 27a and removing the second floating gate layer 32, leaving the second floating gate layer 32 at the two side wall portions of the first floating gate layer 30a. The end point when removing the second floating gate layer 32 can be easily judged by making it the time when the mask layer 27a with the reduced etching area is exposed. Thus it is possible to prevent under-etching causing short-circuits with the adjoining memory cell or over-etching causing the height of the floating gate becoming lower than the design, and possible to suppress fluctuations in the amount of etching and achieve stable production.

Figure 16I:
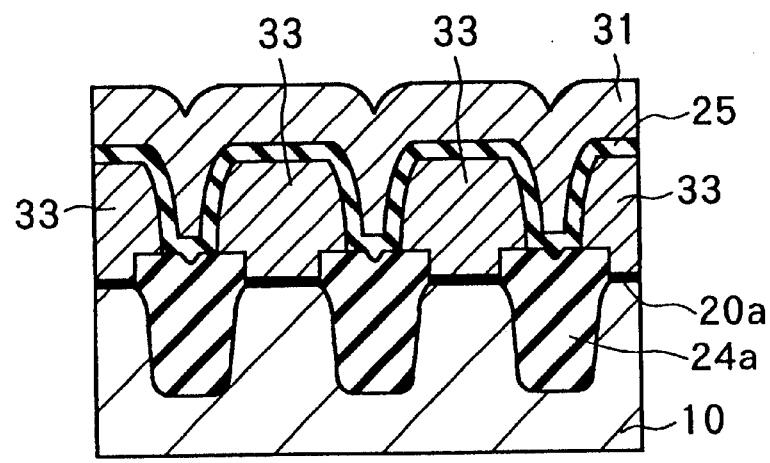

Next, as shown in FIG. 16I, phosphoric acid based wet etching is used to remove the mask layer 27a, then an ONO film is formed covering the floating gate layer 33 and make an inter-layer insulating film 25. Next, for example, a control gate (word line) 31 comprised of polycrystalline silicon is formed covering the top surface of the inter-layer insulating film 25. As the control gate 31, to lower the resistance, use may be made of a polycide structure such as a stacked structure of polycrystalline silicon and tungsten silicide. Here, as the thickness of the control gate 31, a thickness sufficient for burying the step difference formed by the floating gate is preferable to facilitate the later lithography step.

Next, the control gate 31 is used as a mask to etch the floating gate layer 33 and the inter-layer insulating film 25 to form a patterned floating gate 33a and the inter-layer insulating film 25a. Next, the gate electrodes are formed at the selection MOS transistor portion and the source-drain diffusion layers are formed by an ion implantation step, methods based on ordinary methods are used to form MOS transistors of the peripheral circuit portion of a NAND type flash memory, for example the CVD method is used to form an inter-layer insulating film 28 of silicon oxide, a contact hole BC reaching the drain diffusion layer 13' of the selection transistor is formed, a buried electrode 34 and bit line 35 and other interconnections are formed, a passivation film is deposited, a pad opening portion is formed, etc. to form a NAND type flash memory using SA-STI cells as shown in FIG. 13A and FIG. 13B.

According to the method of producing the semiconductor nonvolatile memory device of the above embodiment, like in the first embodiment, since, as the floating gate 33a, a pair of protruding portions (second floating gates) are formed connected to the two side walls in the interconnection direction of the control gate 28 compared with the floating gate (first floating gate) of the related art, it is possible to increase the surface area contributing to the capacitive coupling ratio with the control gate compared with a floating gate of a conventional shape and to increase the capacitive coupling ratio of the control gate and the floating gate. Due to this, even if the area of the memory cell is reduced, it is possible to secure the necessary capacitive coupling ratio between the control gate and floating gate, prevent erroneous operation in a write operation on a memory cell and a reduction in quality, reduce the operating voltage and the power source voltage, and suppress an increase in the area of the booster circuit and the boosting time, and thereby enable producing a semiconductor nonvolatile memory device high in quality and improved in degree of integration.

Further, since the second floating gate layer 32a is formed by the method of forming the second floating gate layer 32 over the entire surface at an upper layer of the mask layer 27a and removing the second floating gate layer 32 leaving the second floating gate layer 32 at the two side wall portions of the first floating gate layer 30a, it is easy to judge the end point of removing of the second floating gate layer 32 by making it the time when the mask layer 27a reduced in etching area is exposed and suppress the fluctuations in the amount of etching and thereby enable stable production.

Further, like in the first embodiment, in the step of forming the control gate (word line) 31 at the upper layer of the inter-layer insulating film, then using the control gate as a mask and etching the floating gate layer 30a and inter-layer insulating film 25 for patterning, the second floating gates formed connected to the two side walls in the interconnection direction of the control gate with respect to the first floating gate serve as masks for protection of the wall portions of the semiconductor substrate 10 side of the element isolation insulating film 24a. Even if part of the element isolation insulating film 24a is removed and an indentation D is formed, it is possible to prevent exposure of parts of the side walls of the element isolation trench formed in the semiconductor substrate 10. Even if the floating gate 30a is removed, it is possible to prevent etching down to the semiconductor substrate 10. In the above way, it is possible to produce a semiconductor nonvolatile memory device high in quality and improved in degree of integration.

Third Embodiment

The semiconductor nonvolatile memory device according to the third embodiment of the present invention is a NAND type flash memory using SA-STI cells in the same way as the first embodiment. FIG. 7A and FIG. 7B are a plan view and equivalent circuit diagram of the same. The configuration is similar to that of the first embodiment and therefore an explanation will be omitted.

Figure 17A:
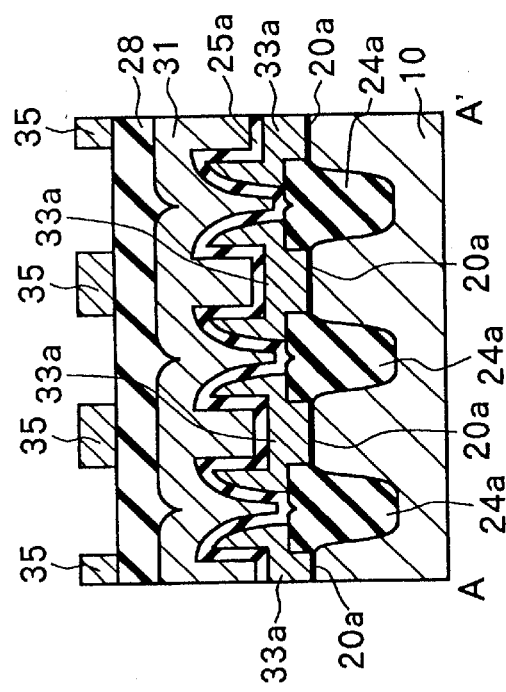
FIG. 17A is a sectional view along the line A–A' of FIG. 7A of the semiconductor nonvolatile memory device according to the third embodiment and FIG. 17B is a sectional view along the line B–B' of FIG. 7A.
Figure 17B:
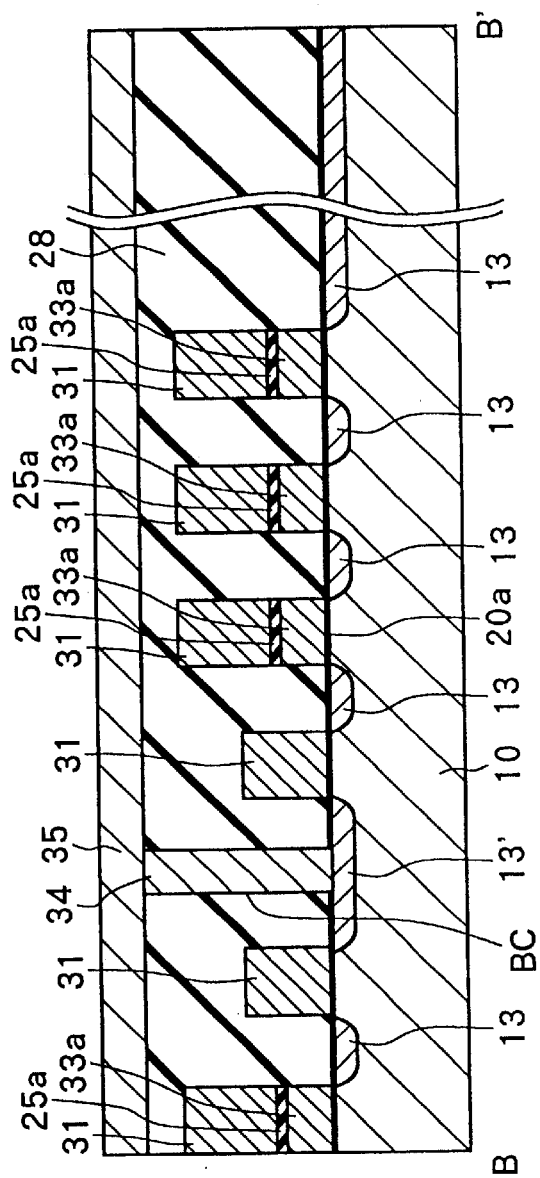

A sectional view along the line A–A' in FIG. 7A of the semiconductor nonvolatile memory device is shown in FIG. 17A and a sectional view along the line B–B' is shown in FIG. 17B. As shown in FIG. 17A, a gate insulating film (tunnel insulating film) 20a comprised of for example a thin film of silicon oxide is formed on an active region of the semiconductor substrate 10 isolated by the trench type element isolation insulating film 24a. A floating gate 33a comprised of for example polycrystalline silicon is formed at an upper layer of the same. Here, the floating gate 33a is shaped with a pair of protruding portions (second floating gates) formed connected with the two side walls in the interconnection direction of the control gate 28 as compared with the floating gate (first floating gate) of the related art shown in FIG. 3A and the second floating gates are formed higher than the first floating gate, so the two facing ends are formed higher than the portion between the ends. Further, for example, an inter-layer insulating film 25a comprised of an ONO film is formed at an upper layer of the floating gate 33a. A control gate (word line) 31 comprised of for example polycrystalline silicon is formed covering the top surface of the inter-layer insulating film 25a. Further, as shown in FIG. 17B, source-drain regions 13 are formed in the semiconductor substrate 10 at the two sides of the control gate 31. Due to this, a field-effect transistor having a floating gate 33a covered by an insulating film between the control gate 31 and the channel formation region in the semiconductor substrate 10 is constituted. The transistors are connected in series in a NAND format to form a NAND column.

A selection transistor formed using the control gate 31 in a memory cell as a gate electrode is connected to one end of the NAND column. The selection transistor and the memory transistors constituting the NAND column are for example covered by an inter-layer insulating film 28 comprised of silicon oxide for example. A bit contact hole BC reaching the drain diffusion region 13' of the selection transistor is opened in the inter-layer insulating film 28 and is connected through a buried electrode 34 to a bit line 35 comprised of for example aluminum. Further, a not shown selection transistor is connected to another end of the NAND column and has a source diffusion region connected to a source line formed as a diffusion region in the semiconductor substrate 10 for example.

In the above semiconductor nonvolatile memory device, as shown in FIG. 17A, the element isolation region is formed by the so-called self-aligned shallow trench isolation (SA-STI) method and is a structure suited to high integration. Further, the floating gate 33a is shaped formed with the pair of protruding portions (second floating gates) connected to the two side walls in the interconnection direction of the control gate 28 as compared with the floating gate (first floating gate) of the related art and the second floating gates are formed higher than the first floating gate, so the two facing ends are formed higher than the height of the portion between the ends. The surface area contributing to the capacitive coupling ratio with the control gate can be increased from the floating gate of the shape of the related art and the capacitive coupling ratio of the control gate and floating gate can be increased. Due to this, it is possible to secure the necessary capacitive coupling ratio of the control gate and floating gate even if reducing the memory cell area, prevent erroneous operations in the write operation on a memory cell etc. and a reduction of the quality, reduce the operating voltage and power source voltage, suppress an increase in the area of the booster circuit and boosting time, and thereby realize a semiconductor nonvolatile memory device high in quality and improved in degree of integration.

Further, since this is a semiconductor nonvolatile memory device comprised of a plurality of memory transistors connected in series, it is advantageous for higher integration. By increasing the number of memory cells and increasing the area of the memory cell portion, it is possible to make the area of the bit line contact portion, selection MOS transistor portion, and source line portion added negligible in extent compared with the area of the memory cell portion and therefore possible to fabricate a semiconductor nonvolatile memory device with the highest degree of integration within the limit of the minimum feature size.

Figure 18A:
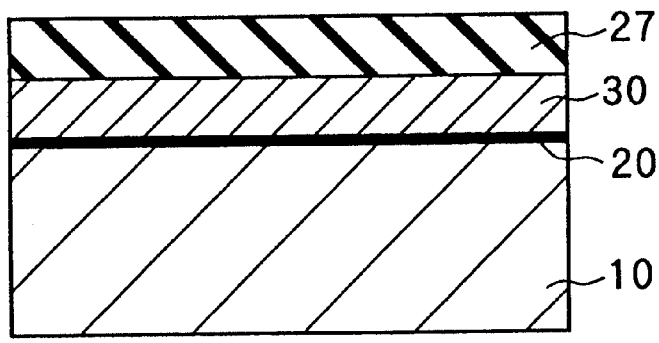

The method of producing the above semiconductor nonvolatile memory device will be explained with reference to a sectional view taken along the line A–A' in FIG. 7A. First, as shown in FIG. 18A, a gate insulating film 20 for forming the tunnel insulating film of a floating gate type MOS transistor is formed to a thickness of about 10 nm on the surface of the semiconductor substrate 10 on which is formed a P-type well etc. for isolation of the memory cell portion, peripheral circuit portion, etc. of a NAND type flash memory using for example the thermal oxidation method. Next, for example, the CVD method etc. is used to deposit an impurity-doped polycrystalline silicon film or amorphous silicon film to a thickness of about 100 to 200 nm to form a first floating gate layer 30, then for example the CVD method etc. is used to deposit a silicon nitride film to a thickness of about 100 to 200 nm to form the mask layer 27. Here, as the mask layer 27, any material may be used enabling a selective etching rate between the polycrystalline silicon or amorphous silicon of the floating gate material and the silicon nitride of the later mentioned element isolation insulating film material. It is not limited to silicon nitride.

Figure 18B:
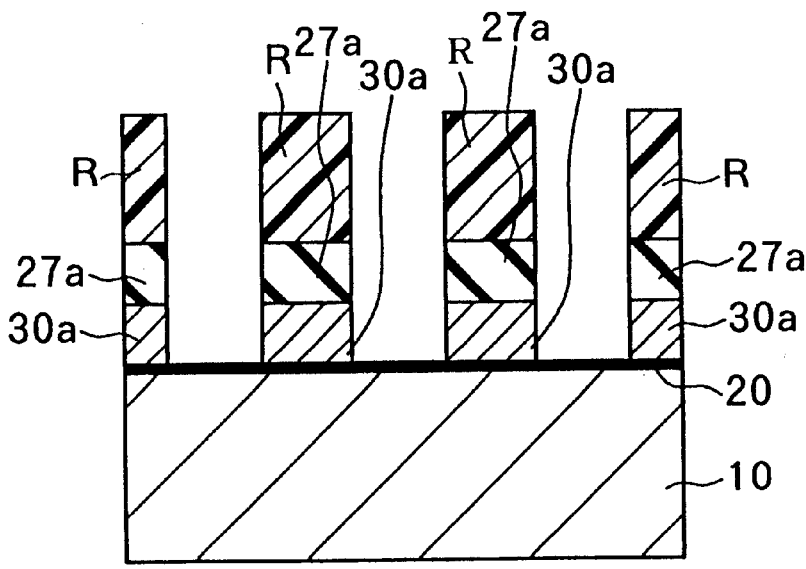

Next, as shown in FIG. 18B, photolithography is used to form a resist film R of a pattern of the floating gate at an upper layer of the mask layer 27, then for example, RIE or other dry etching is performed to pattern the mask layer 27/first floating gate layer 30 to remove the mask layer 27/first floating gate layer 30 at the element isolation region and form the mask layer 27a and first floating gate layer 30a covering the element region of the SA-STI cell.

Note that during the patterning of the mask layer 27/first floating gate layer 30, the thin gate insulating film 20 under the first floating gate layer 30 of the element isolation region may also be etched in state.

Figure 18C:
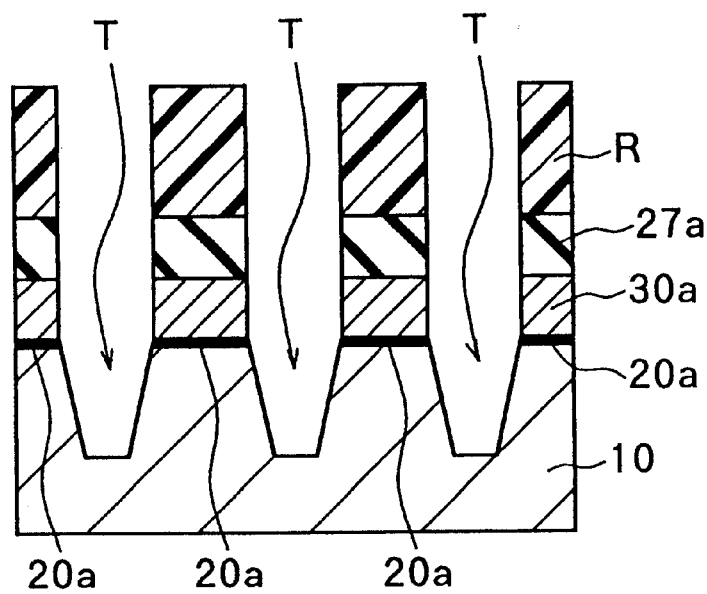

Next, as shown in FIG. 18C, the above resist film R is used as a mask for ECR plasma etching etc. to etch the gate insulating film 20 and the semiconductor substrate 10 at the element isolation region and form-the element isolation trench T. At this time, to facilitate burying the element isolation trench T by an insulator in a later step, the element isolation trench T is preferably formed with a somewhat tapered shape.

Figure 19D:
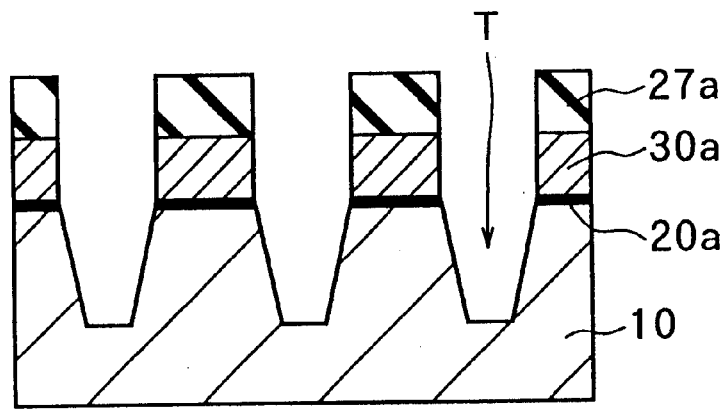
Figure 19E:
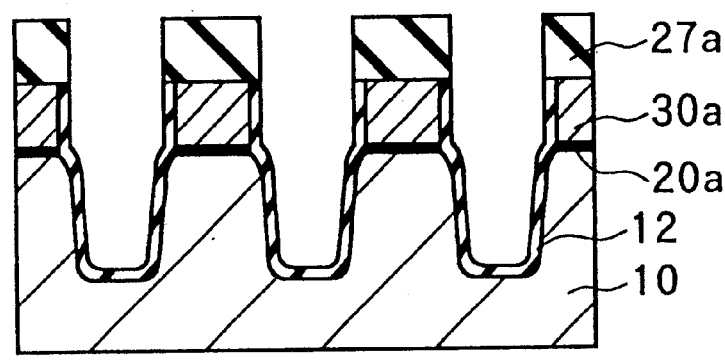

Next, as shown in FIG. 19D, the resist film R is peeled off, then, as shown in FIG. 19E, the damage to the gate insulating film 20a and the element isolation trench T surface portion at the time of formation of the element isolation trench T by the drying etching is removed by heat treatment in a nitrogen atmosphere and then thermal oxidation is performed to form an element isolation trench covering film 12 comprised of a thermal oxide film at the surface of the element isolation trench T. The thickness of the element isolation trench covering film 12 may be made for example about 10 to 30 nm, but to reduce the leakage current at the source-drain junction formed later, it is preferable to form it as thick as possible. Further, at the time of the thermal oxidation, the side walls of the first floating gate layer 30a are also oxidized. Next, the ion implantation method may be used to for example implant boron (B) ions and thereby form a (not shown) channel stopping layer at the bottom of the element isolation trench T of the element isolation region.

Figure 19F:
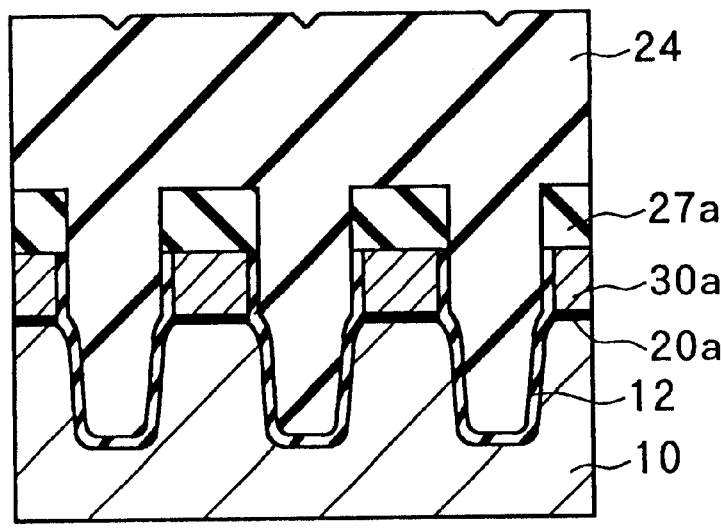

Next, as shown in FIG. 19F, for example, the bias CVD method or the conformal CVD method is used to deposit a silicon oxide film between the element isolation trench T portion and the first floating gate layer 30a to bury the same and form the element isolation layer 24. The thickness of the deposited element isolation layer 24 depends on the width of the element isolation trench T. A sufficient thickness is required for the film grown from the two walls of the element isolation trench T to be buried in the element isolation trench T.

Figure 20G:
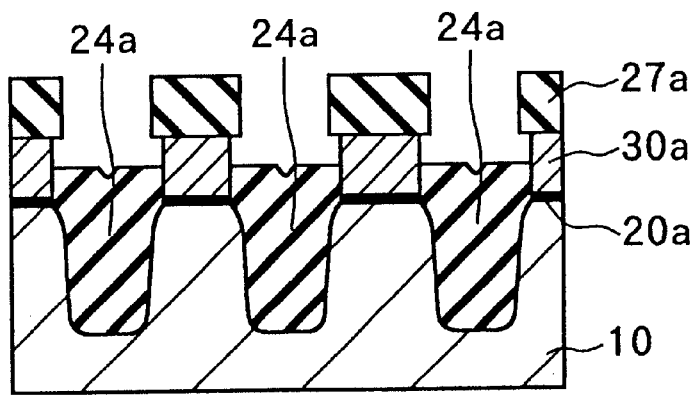

Next, as shown FIG. 20G, for example, fluoric acid based wet etching is used for etch backing an element isolation layer 24 having selectivity with respect to the mask layer of silicon nitride and first floating gate layer 30a of polycrystalline silicon etc. and form an element isolation insulating film 24a buried in the element isolation trench T by self-alignment with the active region of the semiconductor substrate 10. If the above selectivity can be obtained, dry etching may also be performed. At this time, the etching is stopped at a position where the surface of the element isolation insulating film 24a is lower than the lower surface of the mask layer 27a and higher than the gate insulating film 20a. Here, since the element isolation layer 24 and the element isolation trench covering film 12 are integral, the boundary is omitted in the illustration.

Figure 20H:
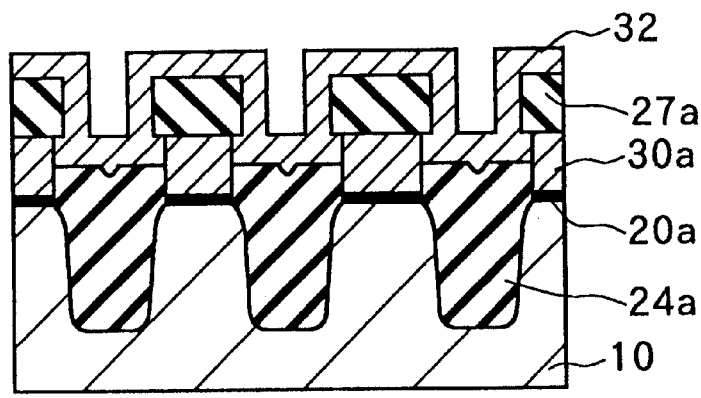

Next, as shown in FIG. 20H, for example the CVD method is used to deposit polycrystalline silicon or amorphous silicon over the entire surface to form the second floating gate layer 32.

Figure 20I:
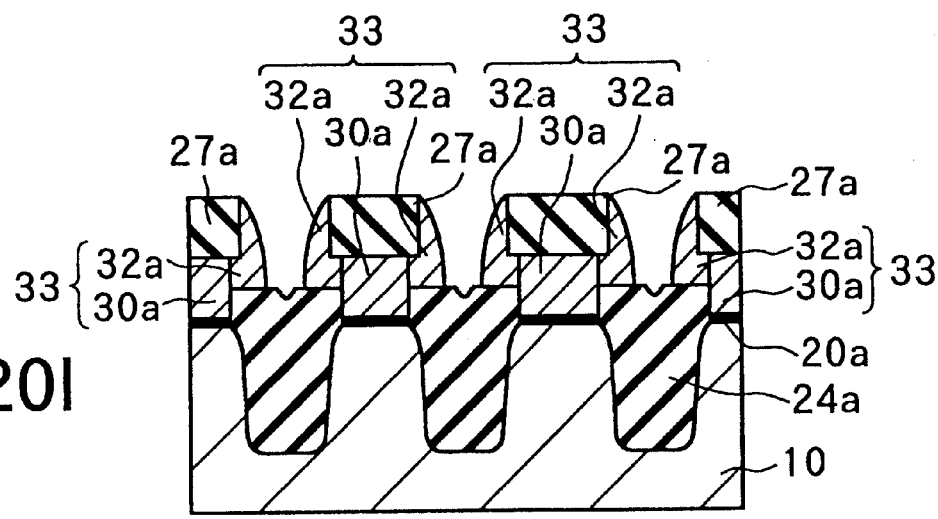

Next, as shown in FIG. 20I, for example, RIE or other etching is used to etch back the entire surface and remove the second floating gate layer 32 leaving the second floating gate layer 32 at the mask layer 27a and the two side wall portions of the first floating gate layer 30a. Due to this, second floating gate layers 32a are formed connected to the first floating gate layer 30a at its two side walls. The first floating gate layer 30a and the second floating gate layer 32a form the floating gate layer 33. In this way, since the second floating gate layer 32a is formed by the method of forming the second floating gate layer 32 over the entire surface at an upper layer of the mask layer 27a and removing the second floating gate layer 32 leaving the second floating gate layer 32 at the two side wall portions of the first floating gate layer 30a, the end point when removing the second floating gate layer 32 can be easily judged by making it the time when the mask layer 27a with the reduced etching area is exposed Thus it is possible to prevent under-etching causing short-circuits with the adjoining memory cell or over-etching causing the height of the floating gate becoming lower than the design and possible to suppress fluctuations in the amount of etching and achieve stable production. Further, it is possible to make the second floating gate layer 32a higher than the first floating gate layer 30a by the amount of thickness of the mask layer 27a and possible to form the two facing ends higher than the height between the ends, so it is possible to increase the surface area contributing to the capacitive coupling ratio with the control gate over the floating gate of the type of the related art.

Figure 21J:
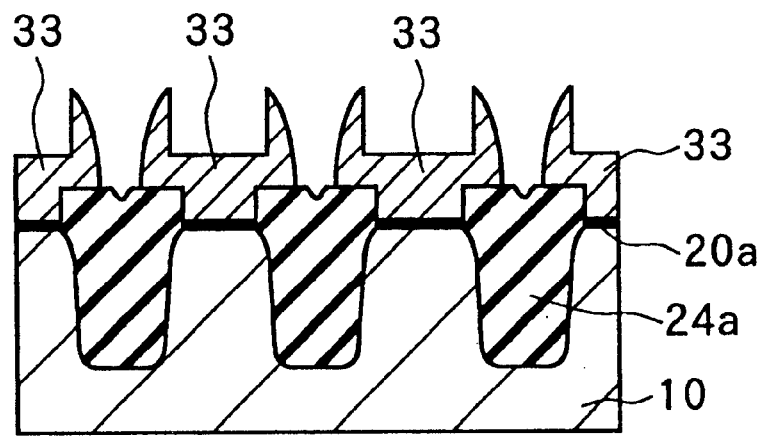
Figure 21K:
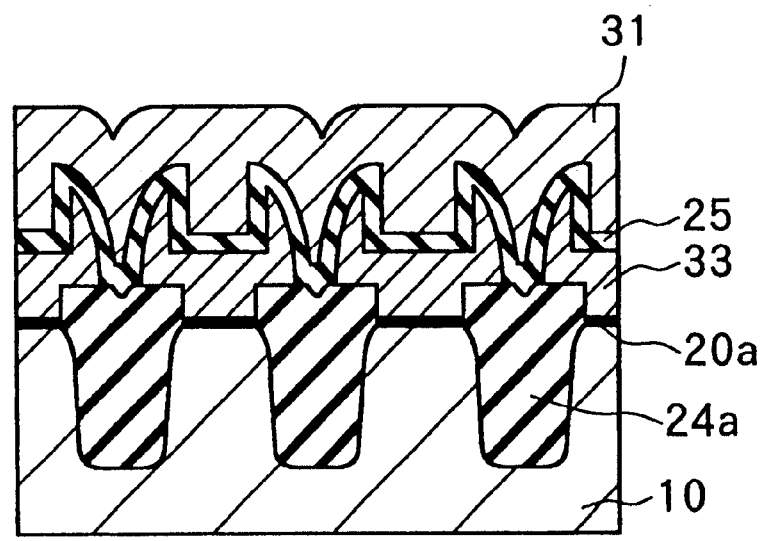

Next, as shown in FIG. 21J, phosphoric acid based wet etching is used to remove the mask layer 27a, then as shown in FIG. 21K, an ONO film is formed covering the floating gate layer 33 and make an inter-layer insulating film 25. Next, for example, a control gate (word line) 31 comprised of for example polycrystalline silicon is formed covering the top surface of the inter-layer insulating film 25. As the control gate 31, to lower the resistance, use may be made of a polycide structure such as a stacked structure of polycrystalline silicon and tungsten silicide. Here, as the thickness of the control gate 31, a thickness sufficient for burying the step difference formed by the floating gate is preferable to facilitate the later lithography step.

Next, the control gate 31 is used as a mask to etch the floating gate layer 33 and the inter-layer insulating film 25 to form a patterned floating gate 33a and the inter-layer insulating film 25a. Next, the gate electrodes are formed at the selection MOS transistor portion and the source-drain diffusion layers are formed by an ion implantation step, methods based on ordinary methods are used to form MOS transistors of the peripheral circuit portion of a NAND type flash memory, for example the CVD method is used to form an inter-layer insulating film 28 of silicon oxide, a contact hole BC reaching the drain diffusion layer 13' of the selection transistor is formed, a buried electrode 34 and bit line 35 and other interconnections are formed, a passivation film is deposited, a pad opening portion is formed, etc. to form a NAND type flash memory using SA-STI cells as shown in FIG. 17A and FIG. 17B.

According to the method of producing the semiconductor nonvolatile memory device of the above embodiment, since, as the floating gate 33a, a pair of protruding portions (second floating gates) are formed connected to the two side walls in the interconnection direction of the control gate 28 compared with the floating gate (first floating gate) of the related art shown in FIG. 3A and the second floating gate is formed higher than the first floating gate, the two facing ends are formed higher than the portions between the ends and it is possible to increase the surface area contributing to the capacitive coupling ratio with the control gate compared with a floating gate of a conventional shape and to increase the capacitive coupling ratio of the control gate and the floating gate. Due to this, even if the area of the memory cell is reduced, it is possible to secure the necessary capacitive coupling ratio between the control gate and floating gate, prevent erroneous operations in a write operation on a memory cell and a reduction in quality, reduce the operating voltage and the power source voltage, and suppress an increase in the area of the booster circuit and the boosting time, and thereby enable producing a semiconductor nonvolatile memory device high in quality and improved in degree of integration.

Further, since the second floating gate layer 32a is formed by the method of forming the second floating gate layer 32 over the entire surface at an upper layer of the mask layer 27a and removing the second floating gate layer 32 leaving the second floating gate layer 32 at the two side wall portions of the first floating gate layer 30a, it is easy to judge the end point of removing the second floating gate layer 32 by making it the time when the mask layer 27a reduced in etching area is exposed and suppress the fluctuations in the amount of etching and thereby enable stable production.

Figure 22A:
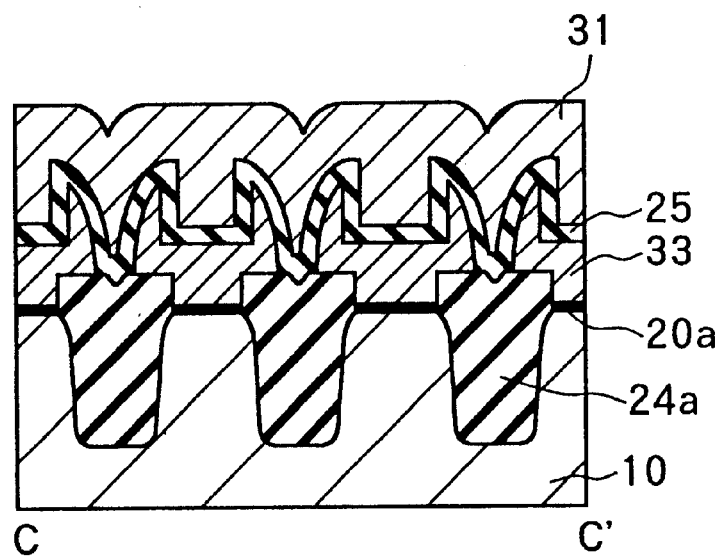
Figure 22B:
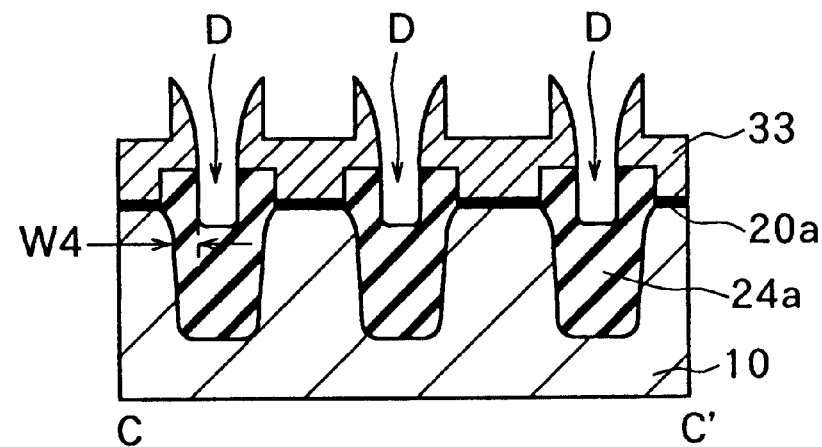
Figure 22C:
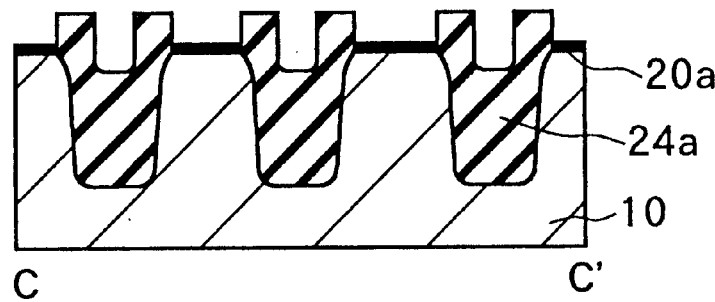

Further, as shown in FIG. 21K, in the step of forming the control gate (word line) 31 at the upper layer of the inter-layer insulating film, then using the control gate as a mask and etching the floating gate layer 30a and inter-layer insulating film 25 for patterning, in the sectional view along the line C–C' in FIG. 7A, the control gate 31, inter-layer insulating film 25, and floating gate 30a are removed, but as shown in FIG. 22A, when removing the control gate 31 and the inter-layer insulating film 25 from the state of formation of the control gate 31, as shown in FIG. 22B, the second floating gates formed connected to the two side walls in the interconnection direction of the control gate with respect to the first floating gate protrude out from the walls of the semiconductor substrate 10 side of the element isolation insulating film 24a by the amount of the distance W4 and serve as masks for protecting the wall portions. Even if part of the element isolation insulating film 24a is removed and an indentation D is formed, it is possible to prevent exposure of part of the side walls of the element isolation trench formed in the semiconductor-substrate 10. Therefore, as shown in FIG. 22C, even if the floating gate 30a is removed, it is possible to prevent etching up to the semiconductor substrate 10. As explained above, it therefore becomes possible to produce a semiconductor nonvolatile memory device high in quality and increased in degree of integration.

Further, while the present invention was explained with reference to three embodiments, the present invention is not limited in any way to these embodiments.

For example, the explanation was made of the polycide structure interconnections of the control gates etc. comprised of polycide film comprised of polycrystalline silicon and tungsten silicide ($WSi_2$) film, but they may also be comprised of polycrystalline silicon film alone or polycide film comprised of polycrystalline silicon film and an $MoSi_2$ film, $CoSi_2$ film, $TiSi_2$ film, or other high melting point metal silicide film. As the substrate, in addition to an ordinary silicon substrate, preferably use is made of a substrate of a silicon (semiconductor)-on-insulator (SOI) structure comprised of a silicon semiconductor layer at an upper layer of an oxide film or other insulating film.

Further, in the embodiments, the explanation was made of a NAND type semiconductor nonvolatile memory device, but the invention is not limited to the NAND type and may be applied to a NOR type or DINOR type semiconductor nonvolatile memory device.

In addition, the process equipment and process conditions can be suitably changed within the scope of the technical idea of the present invention.

Summarizing the effect of the invention, as clear from the above explanation, the present invention provides a semiconductor nonvolatile memory device using SA-STI cells improved in quality and suited for higher integration.

Further, according to the method of producing the semiconductor nonvolatile memory device using SA-STI cells, it is possible to produce the above semiconductor nonvolatile memory device of the present invention and possible to easily produce a semiconductor nonvolatile memory device improved in quality.

What is claimed is:

1. A method of producing a semiconductor nonvolatile memory device comprising the steps of:

forming a gate insulating film on a semiconductor substrate having a channel formation region;

forming a first floating gate at an upper layer of the gate insulating film;

forming a mask layer at an upper layer of the first floating gate;

forming an element isolation trench in the semiconductor substrate in a region sandwiched between first floating gates;

forming an element isolation insulating film by burying an insulator in the element isolation trench;

forming a second floating gate layer over an entire surface including an upper layer of the mask layer;

removing the second floating gate layer, leaving parts thereof as floating gates covering facing sides of the mask layer and the first floating gate, and further directly contacting and covering an exposed surface of the element isolation insulating film;

removing the mask layer;

forming an inter-layer insulating film on the first floating gate and the second floating gates;

forming a control gate at an upper layer of the inter-layer insulating film; and forming a source-drain region connected to the channel formation region.

2. A method of producing a semiconductor nonvolatile memory device as set forth in claim 1, wherein the step of forming the element isolation insulating film includes a step of forming an insulator over the entire surface burying the element isolation trench and a step of removing the insulator leaving at least a part thereof buried in the inside of the element isolation trench.

3. A method of producing a semiconductor nonvolatile memory device as set forth in claim 1, which further comprises, after the step of forming the element isolation trench and before the step of forming the element isolation insulating film, a step of forming a covering film on the surface of the element isolation trench.

4. A method of producing a semiconductor nonvolatile memory as described in claim 1, further comprising:

connecting a plurality of said transistors in series to form a NAND column.

5. A method of producing a semiconductor nonvolatile memory as described in claim 4, further comprising:

forming a gate insulating film on an active region of said substrate;

isolating said gate insulating film by a trench type element isolation insulating film.

6. A method of producing a semiconductor nonvolatile memory as described in claim 4, further comprising:

connecting a selection transistor gate to said control gate at one end of said NAND column;

forming a bit contact hole through said inter-layer insulating film.

* * * * *

UNITED STATES PATENT AND TRADEMARK OFFICE
CERTIFICATE OF CORRECTION

PATENT NO. : 6,403,421 B1
DATED : June 11, 2002
INVENTOR(S) : Naoshi Ikeda et al.

It is certified that error appears in the above-identified patent and that said Letters Patent is hereby corrected as shown below:

<u>Title page,</u>
Item [54], Title, should read:
-- SEMICONDUCTOR NONVOLATILE MEMORY DEVICE AND METHOD OF PRODUCING THE SAME INCLUDING FORMING PARTS OF THE FLOATING GATE ON THE ISOLATION INSULATING FILM --

Signed and Sealed this

Twenty-fourth Day of December, 2002

JAMES E. ROGAN
*Director of the United States Patent and Trademark Office*